(12) United States Patent
Nishikido et al.

(10) Patent No.: US 9,143,714 B2
(45) Date of Patent: Sep. 22, 2015

(54) AD CONVERTER AND SOLID-STATE IMAGING APPARATUS USING THE SAME

(71) Applicant: Renesas Electronics Corporation, Kawasaki-shi, Kanagawa (JP)

(72) Inventors: Osamu Nishikido, Kawasaki (JP); Yasutoshi Aibara, Kawasaki (JP); Hirokazu Shimizu, Kawasaki (JP); Satoshi Tatsukawa, Kawasaki (JP); Takayoshi Shigekura, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/174,236

(22) Filed: Feb. 6, 2014

(65) Prior Publication Data

US 2014/0152879 A1 Jun. 5, 2014

Related U.S. Application Data

(63) Continuation of application No. 13/707,198, filed on Dec. 6, 2012, now Pat. No. 8,681,032.

(30) Foreign Application Priority Data

Dec. 8, 2011 (JP) ................................. 2011-269034

(51) Int. Cl.
*H03M 1/12* (2006.01)
*H04N 5/378* (2011.01)
*H03M 1/50* (2006.01)
*H03M 1/08* (2006.01)
(Continued)

(52) U.S. Cl.
CPC ............. *H04N 5/378* (2013.01); *H03M 1/0863* (2013.01); *H03M 1/50* (2013.01); *H03M 1/56* (2013.01); *H03M 1/123* (2013.01); *H04N 5/3577* (2013.01); *H04N 5/374* (2013.01)

(58) Field of Classification Search
CPC ....... H03M 1/56; H03M 1/1019; H03M 1/12; H03M 1/1225; H03M 1/164; H03M 1/0863; H03M 1/123; H03M 1/188; H03M 1/50; H03M 3/49
USPC .................. 341/118, 120, 164, 169, 170, 155
See application file for complete search history.

(56) References Cited

U.S. PATENT DOCUMENTS 5,977,895 A * 11/1999 Murota et al. ................. 341/143
6,518,910 B2 2/2003 Sakuragi et al.
(Continued)

FOREIGN PATENT DOCUMENTS

JP 2007-281540 A 10/2007
JP 2009-118035 A 5/2009

*Primary Examiner* — Linh Nguyen
(74) *Attorney, Agent, or Firm* — Foley & Lardner LLP

(57) ABSTRACT

There is a need to provide an AD converter capable of reducing occurrence of a noise. An AD converter includes an operational amplifier and a clip circuit. The operational amplifier receives ramp voltage and voltage for an analog signal and allows output terminal voltage to transition from an H level to an L level when a change in the ramp voltage reaches the voltage for the analog signal. The clip circuit fixes an output terminal of the operational amplifier to clipping voltage after output voltage for the operational amplifier reaches threshold voltage for a latch circuit. Therefore, the AD converter can limit a range of output voltage, as a source of noise, for the operational amplifier and eliminate an unnecessary change in the output voltage after the threshold voltage for the latch circuit is reached.

11 Claims, 21 Drawing Sheets

(51) Int. Cl.
  *H03M 1/56* (2006.01)
  *H04N 5/357* (2011.01)
  *H04N 5/374* (2011.01)

(56) References Cited

U.S. PATENT DOCUMENTS

| | | | |
|---|---|---|---|
| 6,563,361 B1 * | 5/2003 | Kappes | 327/321 |
| 6,788,237 B1 * | 9/2004 | Bidermann et al. | 341/155 |
| 7,129,883 B2 | 10/2006 | Muramatsu et al. | |
| 7,315,273 B2 | 1/2008 | Muramatsu et al. | |
| 7,567,280 B2 | 7/2009 | Muramatsu et al. | |
| 7,626,618 B2 | 12/2009 | Adachi et al. | |
| 7,755,686 B2 * | 7/2010 | Toyama et al. | 348/300 |
| 7,880,662 B2 | 2/2011 | Bogaerts | |
| 8,174,422 B2 | 5/2012 | Okamoto et al. | |
| 8,253,617 B2 | 8/2012 | Bogaerts | |
| 8,253,809 B2 | 8/2012 | Nishi | |
| 8,446,309 B2 | 5/2013 | Bogaerts | |
| 2002/0196173 A1 * | 12/2002 | Yamamoto | 341/165 |
| 2009/0128653 A1 * | 5/2009 | Tanaka | 348/222.1 |
| 2010/0053396 A1 * | 3/2010 | Okita et al. | 348/301 |
| 2012/0235021 A1 | 9/2012 | Kasai | |
| 2013/0250148 A1 * | 9/2013 | Park et al. | 348/241 |
| 2014/0098271 A1 * | 4/2014 | Hagihara | 348/302 |
| 2014/0368371 A1 * | 12/2014 | Yoo | 341/156 |

* cited by examiner

AD CONVERTER AND SOLID-STATE IMAGING APPARATUS USING THE SAME

CROSS-REFERENCE TO RELATED APPLICATIONS

This application is a continuation of U.S. application Ser. No. 13/707,198, filed Dec. 6, 2012, now issued as U.S. Pat. No. 8,681,032, which claims benefit of priority from the prior Japanese Application No. 2011-269034, filed on Nov. 8, 2011; the entire contents of all of which are incorporated herein by reference.

BACKGROUND

The present invention relates to an AD converter and a solid-state imaging apparatus using the same. More particularly, the invention relates to an AD converter to convert an analog signal into a digital signal and a solid-state imaging apparatus using the AD converter.

A solid-state imaging apparatus such as a CMOS (Complementary Metal Oxide Semiconductor) sensor includes more than one pixel circuit arranged at more than one row and column. Each pixel circuit corresponding to the selected row outputs an analog signal at a level corresponding to the amount of incident light. The columns are provided with more than one AD (Analog to Digital) converter. Each AD converter converts an analog signal output from the pixel circuit at the corresponding column into a digital signal.

Such a solid-state imaging apparatus includes an increasing number of AD converters as the number of pixels increases. To shorten the processing time, more than one AD converter simultaneously performs AD conversion on output signals from pixel circuits corresponding to the selected row. The AD converters are provided with a bias voltage supply line in common to decrease consumption current or reduce a chip area. The AD converter configuration is simplified.

The solid-state imaging apparatus disclosed in patent document 1 suppresses a power supply noise when more than one comparison circuit operates. For this purpose, the solid-state imaging apparatus uses different bias current values for the comparison circuits and thereby applies different operation timings to the comparison circuits.

The solid-state imaging apparatus disclosed in patent document 2 suppresses an effect of power supply noise on a comparison circuit. For this purpose, a capacitor is coupled between a power supply line and a signal line to feed a potential variation on the power supply line back to the signal line.

Patent Document 1: Japanese Unexamined Patent Publication No. 2009-118035

Patent Document 2: Japanese Unexamined Patent Publication No. 2007-281540

SUMMARY

A solid-state imaging apparatus of the related art drastically changes an output signal from the comparison circuit in the AD converter when the output signal inverts. This varies a voltage on the bias voltage supply line due to parasitic capacitance and causes or propagates a noise.

The technology described in patent document 1 uses different operation timings for the comparison circuits and therefore decreases an overall operation speed. The technology described in patent document 2 provides a capacitor for each comparison circuit and therefore increases the circuit area.

It is, therefore, an object of the invention to provide an AD converter capable of reducing noise occurrence and a solid-state imaging apparatus using the AD converter.

An AD converter according to an embodiment includes a clip circuit that fixes voltage at an output node of a comparison circuit to a clipping voltage after the voltage at the output node of the comparison circuit reaches a specified voltage.

The AD converter according to the embodiment fixes voltage at the output node of the comparison circuit to a clipping voltage after the voltage at the output node of the comparison circuit reaches a specified voltage. Therefore, the AD converter can eliminate an output voltage range as a noise source that drastically changes after a specified voltage is reached. The AD converter can reduce occurrence of a noise.

DETAILED DESCRIPTION

First Embodiment

Figure 1:
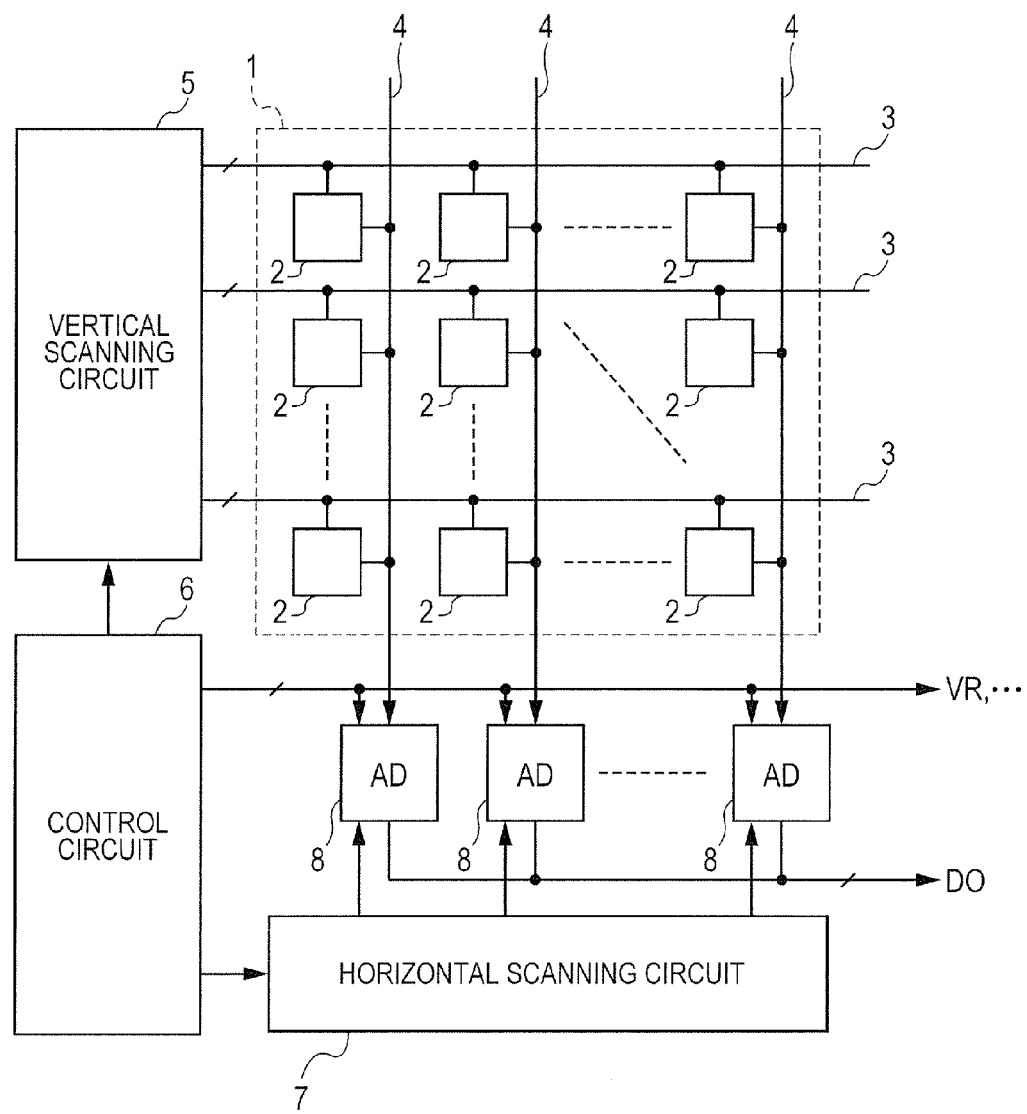
FIG. 1 is a block diagram illustrating a configuration of a solid-state imaging apparatus according to a first embodiment of the invention.

As illustrated in FIG. 1, a solid-state imaging apparatus according to the first embodiment of the invention includes a pixel array 1, a vertical scanning circuit 5, a control circuit 6, a horizontal scanning circuit 7, and more than one AD converter (AD) 8. The pixel array 1 includes more than one pixel circuit 2 provided for rows and columns, more than one row selection line group 3 provided for rows, and more than one signal line 4 provided for columns.

The vertical scanning circuit 5 sequentially selects rows at a specified time interval. The vertical scanning circuit 5 activates each pixel circuit 2 through the row selection line group 3 corresponding to the selected row. The pixel circuit 2 for the selected row outputs an analog signal for reference voltage VIB to the corresponding signal line 4 during a first period and outputs an analog signal for signal voltage VIP to the corresponding signal line 4 during a second period. The pixel circuit 2 outputs the reference voltage VIB if no incident light enters the pixel circuit 2. The pixel circuit 2 outputs the signal voltage VIP if the light enters the pixel circuit 2. A difference between the signal voltage VIP and the reference voltage VIB is equivalent to a voltage at the level corresponding to the amount of incident light entering the pixel circuit 2.

The control circuit 6 controls an entire solid-state image sensor. The horizontal scanning circuit 7 sequentially selects output values from the AD converters 8 corresponding to the signal lines 4 at a specified time interval while the vertical scanning circuit 5 selects one row. The AD converters 8 are coupled to the signal lines 4.

Each AD converter 8 is supplied with an analog signal from the activated pixel circuit 2 via the signal line 4. The AD converter 8 converts the analog signal into a digital signal DO based on ramp voltage VR from the control circuit 6, for example. The AD converter 8 outputs the generated digital signal DO to the outside via a data bus when the horizontal scanning circuit 7 selects the corresponding signal line 4.

Figure 2:
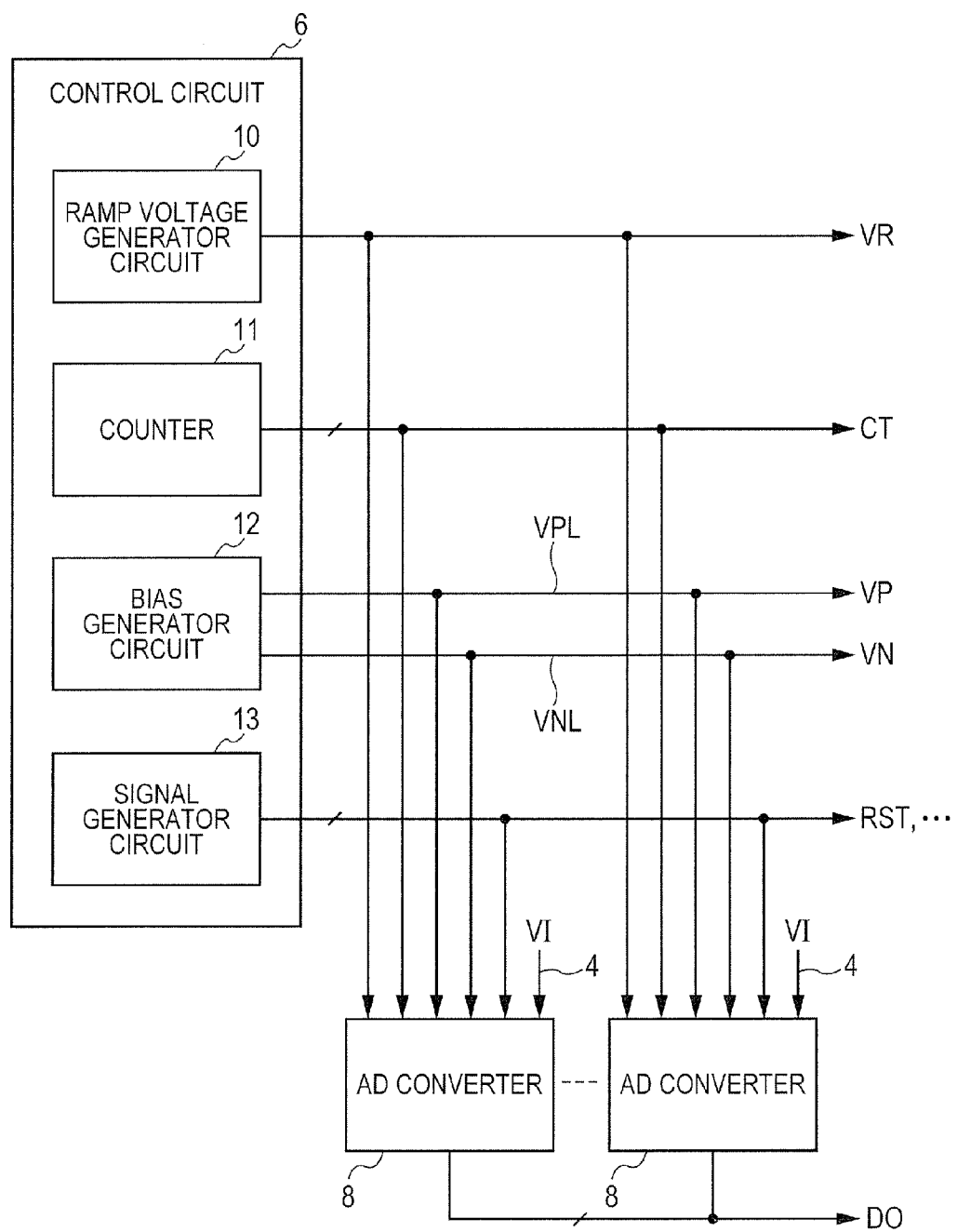
FIG. 2 is a block diagram illustrating a configuration of a control circuit illustrated in FIG. 1.

As illustrated in FIG. 2, the control circuit 6 includes a ramp voltage generator circuit 10, a counter 11, a bias generator circuit 12, and a signal generator circuit 13. The ramp voltage generator circuit 10 generates ramp voltage VR and supplies it to AD converters 8 each time the vertical scanning circuit 5 selects one row. The ramp voltage VR decreases in proportion to the time from a given measurement start time. For example, the ramp voltage generator circuit 10 includes a counter and a DA converter. The counter counts the number of pulses in a clock signal in response to a start signal. The DA converter converts a count value (digital signal) from the counter into the ramp voltage VR. In this example, the ramp voltage VR is assumed to gradually decrease from the highest value.

The counter 11 counts the number of pulses in the clock signal from the above-mentioned measurement start time and supplies the AD converters 8 with a digital signal CT indicating the count value. The bias generator circuit 12 generates less temperature-dependent bias voltages VP and VN. The AD converters 8 are provided with bias voltage supply lines VPL and VNL in common. The bias voltage VP generated from the bias generator circuit 12 is supplied to the AD converters 8 via the bias voltage supply line VPL. The bias voltage VN generated from the bias generator circuit 12 is supplied to the AD converters 8 via the bias voltage supply line VNL. The signal generator circuit 13 generates control signals containing a reset signal RST and supplies the generated signals to the AD converters 8.

The AD converter 8 is supplied with an analog signal via the corresponding signal line 4 and converts the analog signal into the digital signal DO based on the ramp voltage VR, the digital signal CT, the bias voltages VP and VN, and the control signal RST.

Figure 3:
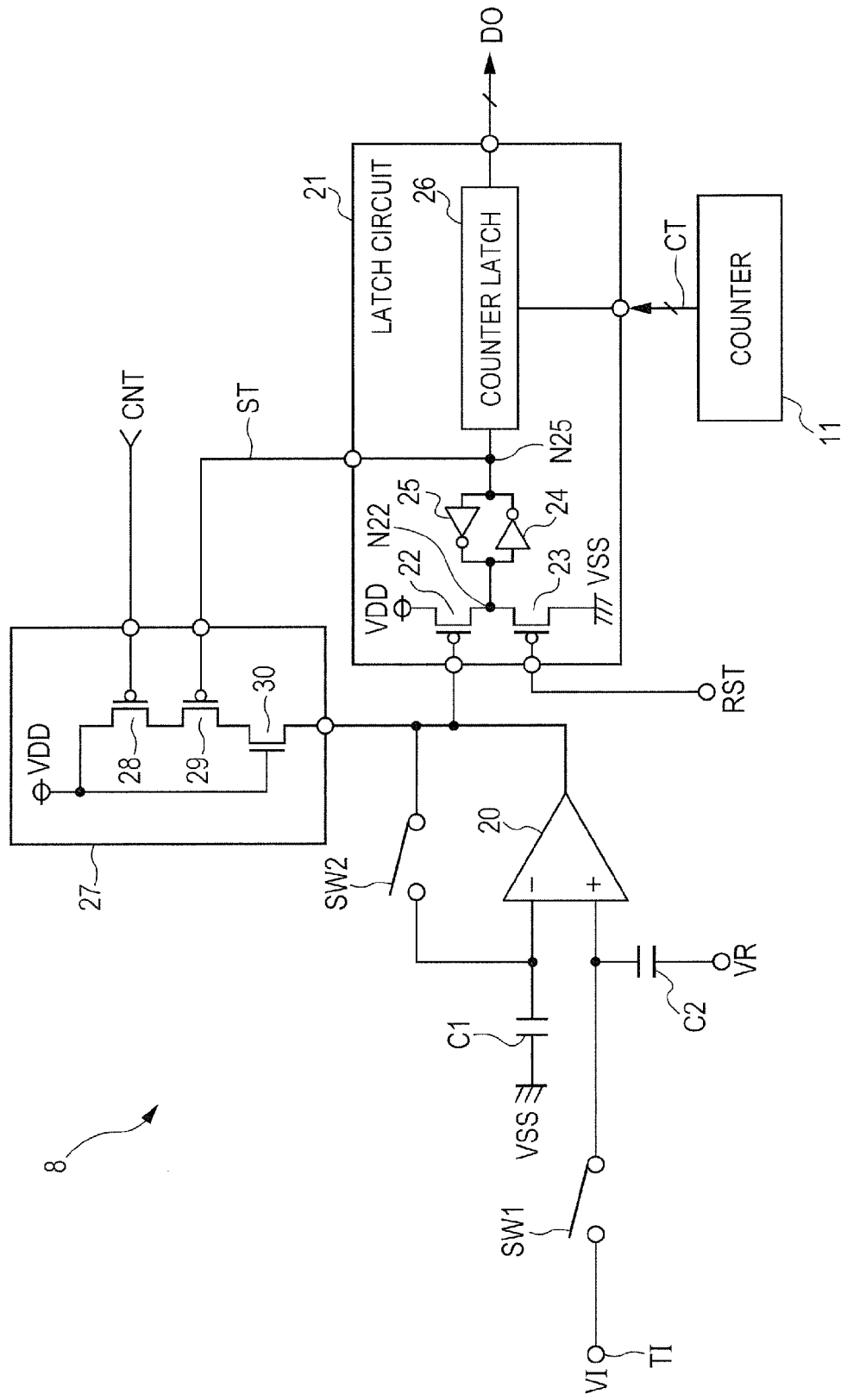
FIG. 3 is a block diagram illustrating a configuration of an AD converter illustrated in FIG. 2.

As illustrated in FIG. 3, the AD converter 8 includes an input terminal TI, switches SW1 and SW2, capacitors C1 and C2, an operational amplifier 20, a latch circuit 21, and a clip circuit 27. The input terminal TI receives voltage VI for an analog signal. One terminal of the switch SW1 is coupled to the input terminal TI and the other terminal thereof is coupled to a non-inverting input terminal (positive terminal) of the operational amplifier 20. The switch SW2 is coupled between an output terminal and an inverting input terminal (negative terminal) of the operational amplifier 20. A control signal from the signal generator circuit 13 in the control circuit 6 controls the switches SW1 and SW2.

The capacitor C1 is coupled between the inverting input terminal of the operational amplifier 20 and a line for fixed potential (e.g., ground voltage VSS). One electrode of the capacitor C2 receives the ramp voltage VR and the other electrode thereof is coupled to the non-inverting input terminal (positive terminal) of the operational amplifier 20.

During the first period, the reference voltage VIB (black level) of an analog signal is supplied to the input terminal TI. The switches SW1 and SW2 turn on. The capacitor C1 is charged with the reference voltage VIB of the analog signal. During the second period, the signal voltage VIP of the analog signal is supplied to the input terminal TI. The switch SW1 turns on and the switch SW2 turns off. The capacitor C2 is charged with the signal voltage VIP of the analog signal. The voltage at the non-inverting input terminal gradually decreases if the switches SW1 and SW2 turn off and the ramp voltage VR gradually decreases. An output voltage from the operational amplifier 20 is inverted to the L level from the H level if the voltage of the non-inverting input terminal drops lower than the voltage at the inverting input terminal.

Figure 4:
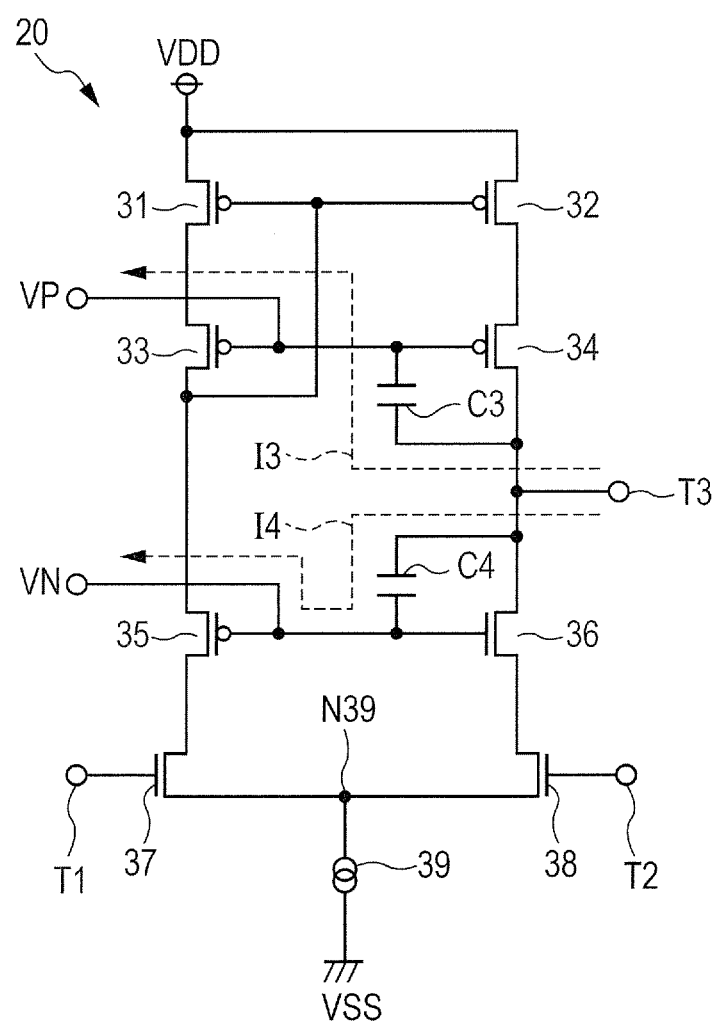
FIG. 4 is a circuit diagram illustrating a configuration of an operational amplifier illustrated in FIG. 3.
Figure 5:
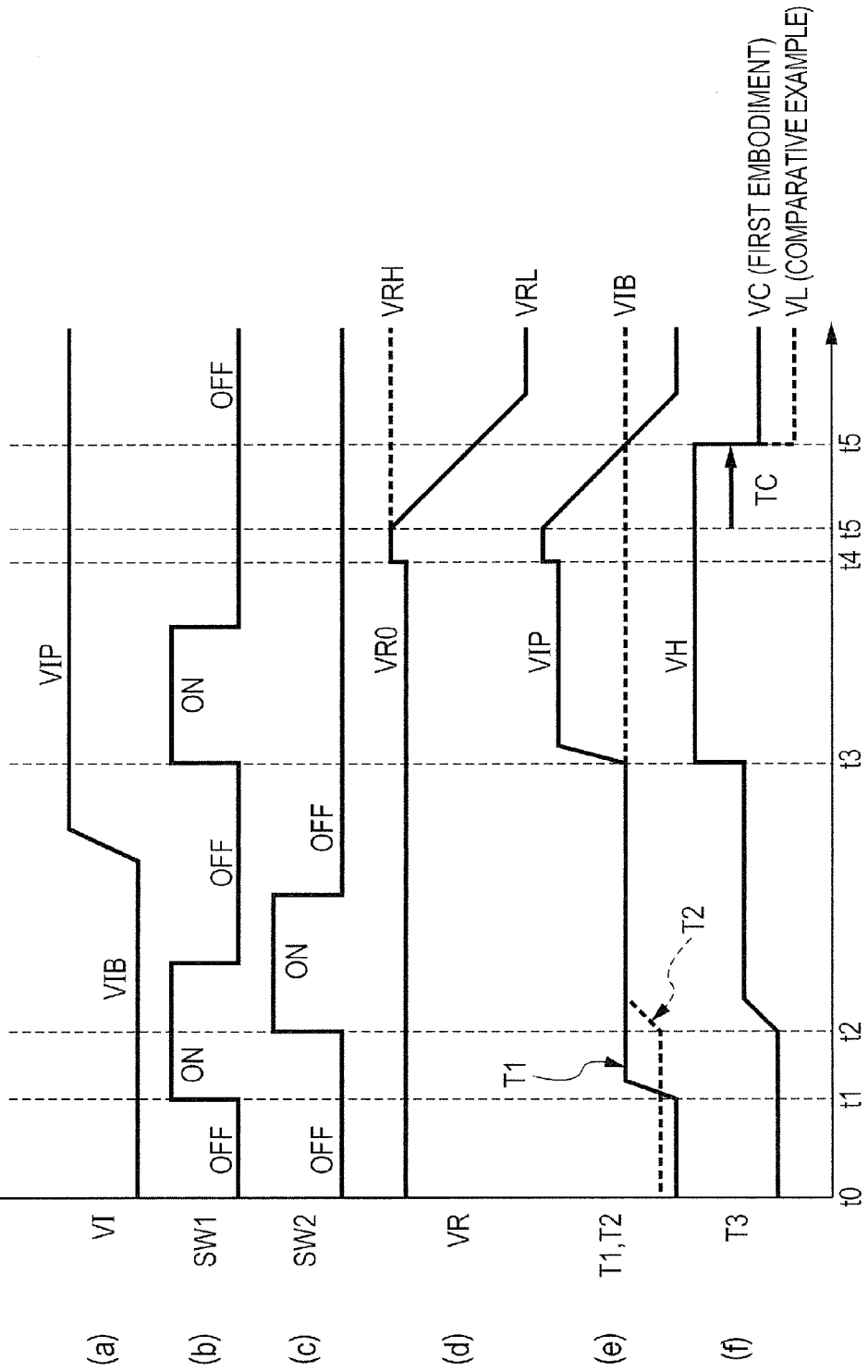
FIGS. 5A through 5F are timing charts illustrating operations of the AD converter illustrated in FIG. 3.

As illustrated in FIG. 4, the operational amplifier 20 includes a non-inverting input terminal T1, an inverting input terminal T2, an output terminal T3, P-channel MOS transistors 31 through 34, N-channel MOS transistors 35 through 38, and a constant current source 39. Gates of the transistors 37 and 38 are coupled to the input terminals T1 and T2, respectively. The sources thereof are coupled to a node N39. The transistors 37 and 38 configure a differential transistor pair. The constant current source 39 allows the node N39 to apply a constant current to the line for the ground voltage VSS.

The transistors 31, 33, and 35 are parallel coupled between a line for a power supply voltage VDD and a drain of the transistor 37. The transistors 32, 34, and 36 are parallel coupled between the line for a power supply voltage VDD and a drain of the transistor 38. The output terminal T3 is coupled drains of the transistors 34 and 36.

Gates of the transistors 31 and 32 are coupled to a drain of the transistor 33. The transistors 31 and 32 configure a current mirror circuit. A current of the same value is applied to the transistors 31 and 32.

Gates of the transistors 33 and 34 receive bias voltage VP. A voltage at the drain of the transistor 31 equals the sum of the bias voltage VP and an absolute value of the threshold voltage for the transistor 33. A voltage at the drain of the transistor 32 equals the sum of the bias voltage VP and an absolute value of the threshold voltage for the transistor 34. The same voltage is applied to the trains of the transistors 31 and 32 because the transistors 33 and 34 use the same threshold voltage. Therefore, the current mirror circuit of the transistors 31 and 32 maintains high precision.

Gates of the transistors 35 and 36 receive the bias voltage VN. A voltage at the drain of the transistor 37 is obtained by subtracting the threshold voltage for the transistor 35 from the bias voltage VN. A voltage at the drain of the transistor 38 is obtained by subtracting the threshold voltage for the transistor 36 from the bias voltage VN. The same voltage is applied to the trains of the transistors 37 and 38 because the transistors 35 and 36 use the same threshold voltage. Therefore, the differential transistor pair of the transistors 37 and 38 maintains high precision.

A current flowing through the transistors 31 through 35 and 37 is larger than a current flowing through the transistors 36 and 38 if the voltage at the non-inverting input terminal T1 is higher than the voltage at the inverting input terminal T2. The output terminal T3 is set to the H level. A current flowing through the transistors 31 through 35 and 37 is smaller than a current flowing through the transistors 36 and 38 if the voltage at the non-inverting input terminal T1 is lower than the voltage at the inverting input terminal T2. The output terminal T3 is set to the L level.

Parasitic capacitance C3 exists between the output terminal T3 and the line between the gates of the transistors 33 and 34. Parasitic capacitance C4 exists between the output terminal T3 and the line between the gates of the transistors 35 and 36. Transient currents I3 and I4 are applied to the bias voltage supply lines VPL and VNL via the parasitic capacitances C3 and C4 when the voltage at the output terminal T3 changes to the H level from the L level, or vice versa.

The transient currents I3 and I4 cause voltage distribution on the bias voltage supply lines VPL and VNL. The operational amplifiers 20 are supplied with the bias voltages VP and VN having different values. The bias voltages VP and VN having different values cause different response speeds to the operational amplifier 20. The AD converters 8 output the digital signals DO having different values even if analog signals at the same level are output to the signal lines 4. As a result, a noise occurs on an image. The first embodiment decreases a noise level.

Now referring back to FIG. 3, the latch circuit 21 includes a P-channel MOS transistor 22, an N-channel MOS transistor 23, inverters 24 and 25, and a counter latch 26. The source of a transistor 22 receives the power supply voltage VDD. The gate thereof receives an output signal from the operational amplifier 20. The drain thereof is coupled to a node N22. The drain of a transistor 23 is coupled to the node N22. The gate thereof receives the reset signal RST. The source thereof receives the ground voltage VSS.

The transistor 23 turns on to reset the node N22 to the L level (ground voltage VSS) if the reset signal RST is set to the H level as an active level for a specified time. An output voltage from the operational amplifier 20 transitions to the ground voltage VSS from the power supply voltage VDD. The transistor 22 turns on to raise the node N22 to the H level from the L level if a difference between the power supply voltage VDD and the output voltage from the operational amplifier 20 exceeds an absolute value of the threshold voltage for the transistor 22.

The inverter 24 outputs an inversion signal ST for a signal occurring at the node N22 to the node N25. The inverter 25 outputs an inversion signal for the signal ST occurring at the node N25 to the node N22. The inverters 24 and 25 configure a latch circuit.

The counter latch 26 latches the digital signal CT from the counter 11 when the stop signal ST occurring at the node N25 lowers to the L level from the H level. The counter latch 26 outputs the latched digital signal CT as the digital signal DO that notifies the amount of incident light to the pixel circuit 2 when the horizontal scanning circuit 7 selects the corresponding signal line 4.

The clip circuit 27 includes P-channel MOS transistors 28 and 29 and an N-channel MOS transistor 30 that are coupled in series between a line for the power supply voltage VDD and an output terminal of the operational amplifier 20. The gate of the transistor 28 receives a control signal CNT. The gate of the transistor 29 receives the stop signal ST. The gate of the transistor 30 is coupled to the line for the power supply voltage VDD.

The control signal CNT is set to the H level to turn off the transistor 28 while the switch SW2 turns on. The control signal CNT is set to the L level to turn on the transistor 28 while the switch SW2 turns off. The transistor 29 turns on and the transistor 30 operates as a diode when the stop signal ST is inverted to the L level from the H level. Current drive capabilities for the transistors 28 through 30 are set to values larger than a value corresponding to the capability for the operational amplifier 20. When the transistors 28 and 29 turn on, the voltage at the output terminal of the operational amplifier 20 is fixed to a clipping voltage VC equivalent to the power supply voltage VDD minus the threshold voltage for the transistor 30.

FIGS. 5A through 5F are timing charts illustrating operations of the AD converter 8 illustrated in FIGS. 3 and 4. If the vertical scanning circuit 5 selects a row, the pixel circuits 2 corresponding to the row are activated. Each of the pixel circuits 2 is reset and outputs reference voltage VIB (black level) of the analog signal to the signal line 4 (time t0).

At time t1, only the switch SW1 turns on for a specified time to charge the non-inverting input terminal T1 of the operational amplifier 20 with the reference voltage VIB of the analog signal. At time t2, only the switch SW2 turns on for a specified time to charge the inverting input terminal T2 of the operational amplifier 20 with the reference voltage VIB of the analog signal.

The switches SW1 and SW2 turn off. Each pixel circuit 2 corresponding to the selected row then outputs the signal voltage VIP of the analog signal to the signal line 4. At time t3, only the switch SW1 turns on for a specified time to charge the non-inverting input terminal T2 of the operational amplifier 20 with the signal voltage VIP of the analog signal. The output terminal T3 of the operational amplifier 20 is set to the H level (VH).

The switch SW1 turns off. At time t4, the ramp voltage VR is then raised to a highest value VRH from a wait value VRO. The highest value VRH is obtained by adding a margin voltage to the wait value VRO. If the ramp voltage VR is raised to the highest value VRH from the wait value VRO, capacitive coupling via the capacitor C2 increases the voltage at the non-inverting input terminal T1 by the margin voltage.

At time t5, the ramp voltage VR linearly drops from the highest value VRH to a lowest value VRL in proportion to the time lapse. While the ramp voltage VR drops in proportion to the time, the capacitive coupling via the capacitor C2 drops the voltage at the non-inverting input terminal T1 in proportion to the time. At time t6, the voltage at the non-inverting input terminal T1 becomes lower than the voltage at the inverting input terminal T2. The operational amplifier 20 then allows the voltage at the output terminal T3 to transition to the L level VL from the H level VH.

The voltage at the output terminal T3 of the operational amplifier 20 reaches a voltage equivalent to the power supply voltage VDD minus an absolute value of the threshold voltage for the transistor 22 in FIG. 3. The transistor 22 then turns on to lower the stop signal ST to the L level from the H level. The output signal CT from the counter 11 is thereby latched to the counter latch 26. The latched signal CT is equivalent to the digital signal DO. Time Tc from time t5 to time t6 corresponds to a difference between the signal voltage VIP and the reference voltage VIB for the analog signal. Increasing the signal voltage VIP elongates time Tc.

Lowering the stop signal ST to the L level turns on the transistor 29 of the clip circuit 27 in FIG. 3. The output terminal T3 of the operational amplifier 20 is fixed to the clipping voltage VC. The clipping voltage VC is lower than the power supply voltage VDD by the threshold voltage for the transistor 30 and is higher than the L level VL for the output voltage from the operational amplifier 20. If the transient currents I3 and I4 occur on the bias voltage supply lines VPL and VNL, changing the output voltage from the operational amplifier 20 can keep the transient currents I3 and I4 at the low level and decrease a noise level.

Comparative Examples

Figure 6:
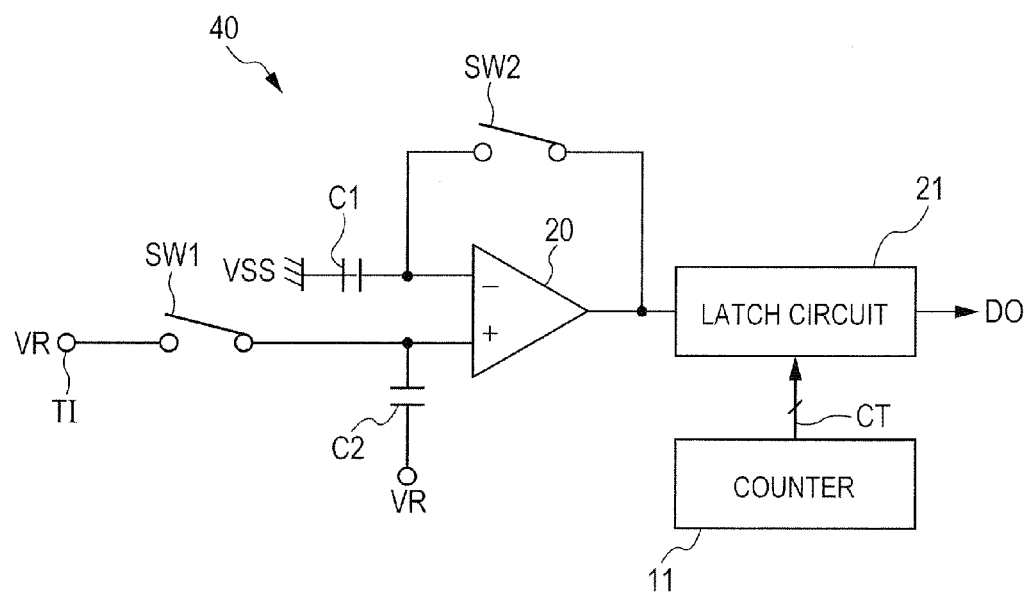
FIG. 6 is a circuit block diagram illustrating a comparative example of the first embodiment.

The following describes effects of the first embodiment in detail. FIG. 6 is a circuit block diagram illustrating a configuration of an AD converter 40 as a comparative example of the first embodiment and is compared to FIG. 3. The AD converter 40 in FIG. 6 differs from the AD converter 8 in FIG. 3 in that the clip circuit 27 is eliminated. Because the AD converter 40 lacks the clip circuit 27, the output voltage from the operational amplifier 20 changes to the L level VL from the H level VH. Therefore, a change in the output voltage from the operational amplifier 20 allows large transient currents I3 and I4 to flow through the bias voltage supply lines VPL and VNL and causes a large noise.

Figure 7:
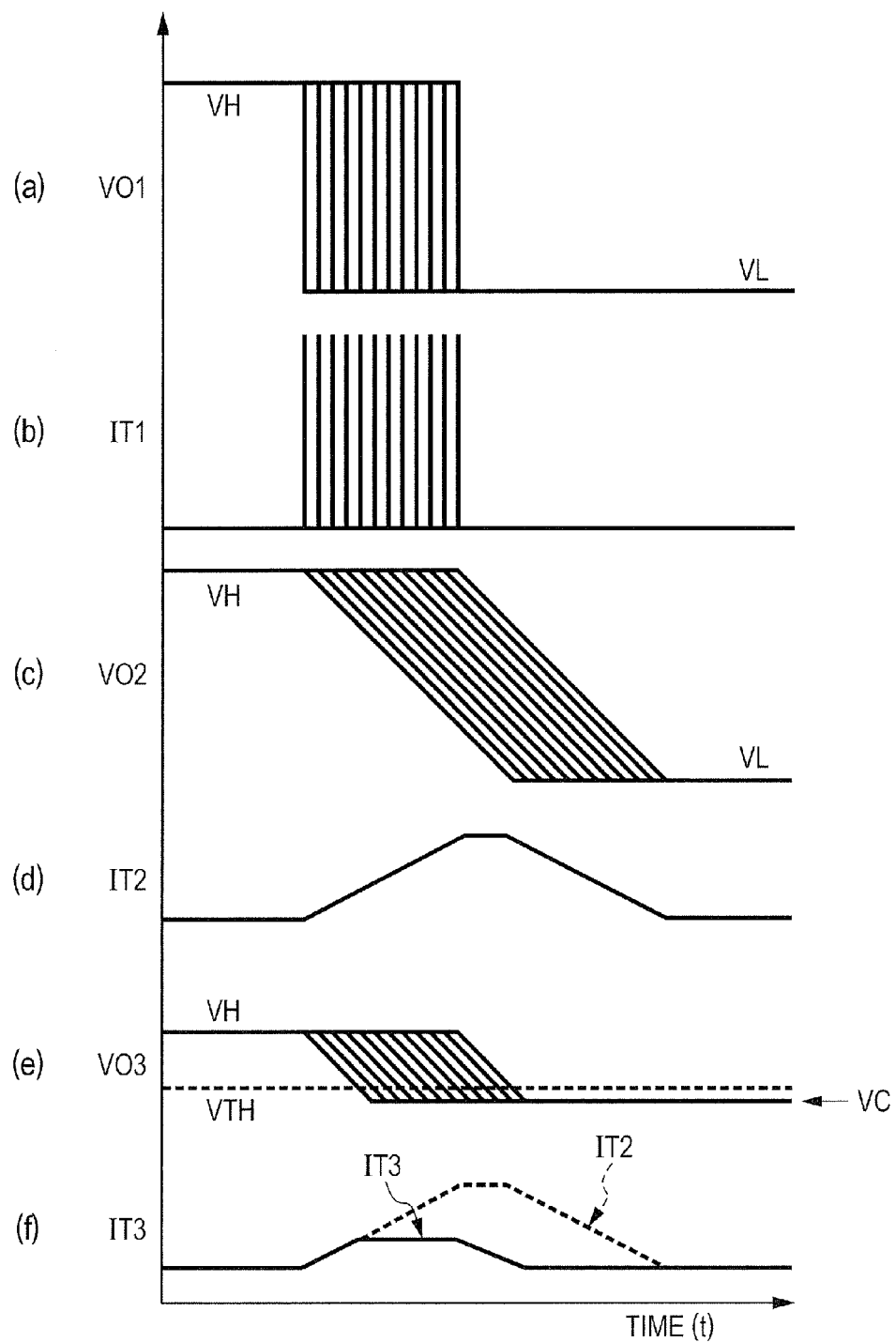
FIGS. 7A through 7F are timing charts illustrating an effect of the first embodiment.

FIGS. 7A and 7B are timing charts schematically illustrating changes in an output voltage VO1 and a transient current IT1 for the operational amplifiers 20 in the AD converter 40 according to a comparative example when the operational amplifier 20 is configured to fast respond. As illustrated in FIG. 7A, the output voltage VO1 from the operational amplifiers 20 drastically lowers from the H level VH to the L level VL. The output voltage VO1 from the operational amplifiers 20 lowers at different times. As illustrated in FIG. 7B, the large transient current IT1, like a pulse, flows through the operational amplifiers 20 in response to the falling edge of the output voltage VO1 from the operational amplifiers 20. The transient current IT1 has a small effect on the other operational amplifiers 20 because the transient current IT1 flows through each operational amplifier 20 in a short period of time. However, the fast responding operational amplifier 20 unfavorably consumes a large amount of current and occupies a large circuit area.

FIGS. 7C and 7D are timing charts schematically illustrating changes in an output voltage VO2 and a transient current IT2 for the operational amplifiers 20 in the AD converter 40 according to a comparative example when the operational amplifier 20 is configured to slow respond. As illustrated in FIG. 7C, the output voltage VO2 from the operational amplifiers 20 gradually transitions from the H level VH to the L level VL. The transient current IT2 flows through each operational amplifier 20 in a predetermined duration. The transient currents IT2 of the operational amplifiers 20 overlap with each other. As illustrated in FIG. 7D, the transient current IT2 having a trapezoid waveform flows through the bias voltage supply lines VPL, and VNL. This transient current IT2 affects the performance of each operational amplifier 20 such as a response speed and causes a noise. However, the slow responding operational amplifier 20 favorably consumes a small amount of current and occupies a small circuit area.

FIGS. 7E and 7F are timing charts schematically illustrating changes in an output voltage VO3 and a transient current IT3 for the operational amplifiers 20 in the AD converter 8 according to the first embodiment. The first embodiment reduces the consumption current and the circuit area. Therefore, each operational amplifier 20 is configured to slow respond. For this reason, the output voltage VO3 from the operational amplifiers 20 gradually transitions from the H level VH to the L level VL as illustrated in FIG. 7E. The output voltage VO3 from the operational amplifier 20 is fixed to the clipping voltage VC lower than a threshold voltage VTH and does not become lower than the clipping voltage VC. The threshold voltage VTH is obtained by subtracting an absolute value of the threshold voltage for the transistor 22 from the power supply voltage VDD. Accordingly, the output voltage VO3 from the operational amplifier 20 is forced to small amplitude. As illustrated in FIG. 7F, the transient current IT3 also decreases. Therefore, the transient current IT3 less affects the performance of each operational amplifier 20 such as the response speed than the comparative example. The noise level is forced to be small.

The first embodiment has described the case where an output signal from the operational amplifier transitions from the H level to the L level. A similar configuration is obviously applicable to a case where an output signal from the operational amplifier transitions from the L level to the H level.

The first embodiment fixes a voltage at the output terminal T3 of the operational amplifier 20 to the clipping voltage VC lower than the threshold voltage VTH for the latch circuit 21 while the threshold voltage VTH is obtained by subtracting an absolute value of the threshold voltage for the transistor 22 from the power supply voltage VDD. The invention is not limited thereto. The clipping voltage VC may be higher than the threshold voltage VTH for the latch circuit 21. In this case, a transient current IT4 may flow through the bias voltage supply lines VPL and VNL if the clipping voltage VC is applied to the output terminal T3 of the operational amplifier 20. The transient current IT4 has the polarity opposite the transient current IT3 illustrated in FIG. 7F. The transient current IT4 may cancel the transient current IT3.

If the AD converter 8 is used for the other purposes, the control signal CNT may be fixed to the H level. The transistor 28 may turn off. The clip circuit 27 may be fixed to be inactive.

First Modification

Figure 8:
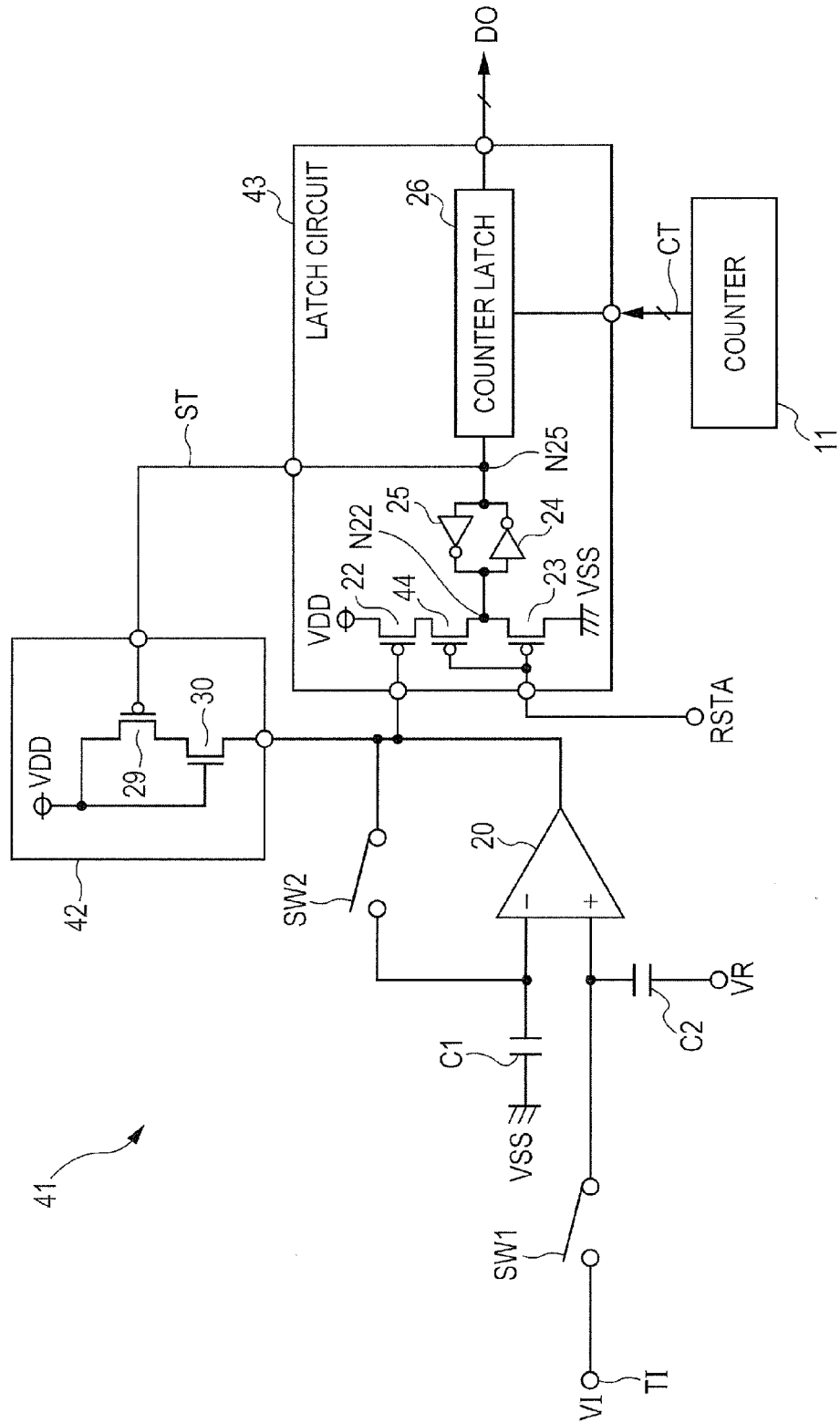
FIG. 8 is a circuit block diagram illustrating a first modification of the first embodiment.

The following describes various modifications of the first embodiment. The modifications replace the AD converters 8 with the other AD converters. FIG. 8 illustrates an AD converter 41 according to the first modification. A clip circuit 42 and a latch circuit 43 replace the clip circuit 27 and the latch circuit 21, respectively. The clip circuit 42 is provided by removing the transistor 28 from the clip circuit 27. The latch circuit 43 is provided by adding a P-channel MOS transistor 44 to the latch circuit 21. The control signal CNT is removed. A reset signal RSTA replaces the reset signal RST. The transistors 29 and 30 of the clip circuit 42 are coupled in series between the line for the power supply voltage VDD and the output terminal of the operational amplifier 20. The source of the transistor 44 is coupled to the drain of the transistor 22. The drain thereof is coupled to the node N22. The gates of the transistors 23 and 44 receive the reset signal RSTA.

The reset signal RSTA is set to the H level while the switch SW2 turns on. The transistor 44 thereby turns off to turn on the transistor 23. The node N22 is set to the L level to turn off the transistor 29 and stop supplying the clipping voltage VC. The first modification can provide the same effect as the first embodiment, eliminate the signal line for supplying the control signal CNT, and simplify the configuration.

Second Modification

Figure 9:
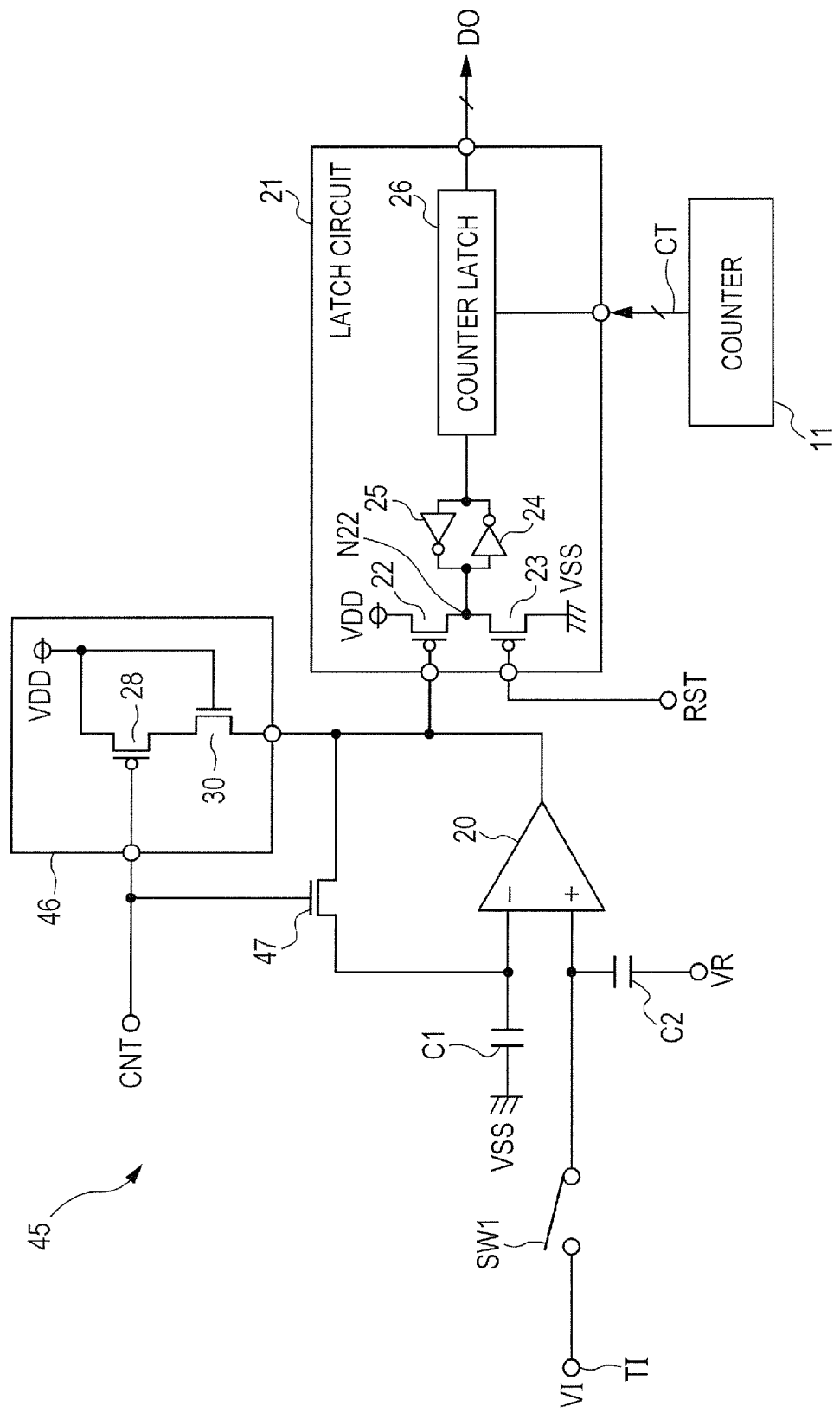
FIG. 9 is a circuit block diagram illustrating a second modification of the first embodiment.

FIG. 9 illustrates an AD converter 45 according to the second modification. A clip circuit 46 replaces the clip circuit 27. An N-channel MOS transistor 47 configures the switch SW2. The clip circuit 46 is provided by removing the transistor 29 from the clip circuit 27. The transistors 28 and 30 of the clip circuit 42 are coupled in series between the line for the power supply voltage VDD and the output terminal of the operational amplifier 20. The drain of the transistor 47 is coupled to the output terminal of the operational amplifier 20. The gate thereof receives the control signal CNT. The source thereof is coupled to the inverting input terminal of the operational amplifier 20.

The control signal CNT is set to the H level while the switch SW2 (transistor 47) turns on. The transistor 28 thereby turns off to stop supplying the clipping voltage VC. The control signal CNT is set to the L level while the switch SW2 (transistor 47) turns off. The transistor 28 thereby turns on to supply the clipping voltage VC to the output terminal of the operational amplifier 20.

The second modification can provide the same effect as the first embodiment and use one signal line to control the transistor 28 and the switch SW2 (transistor 47). The transistor 29 is eliminated to simplify the configuration. However, the second modification limits the clipping voltage VC to being lower than the threshold voltage VTH for the latch circuit 21.

Third Embodiment

Figure 10:
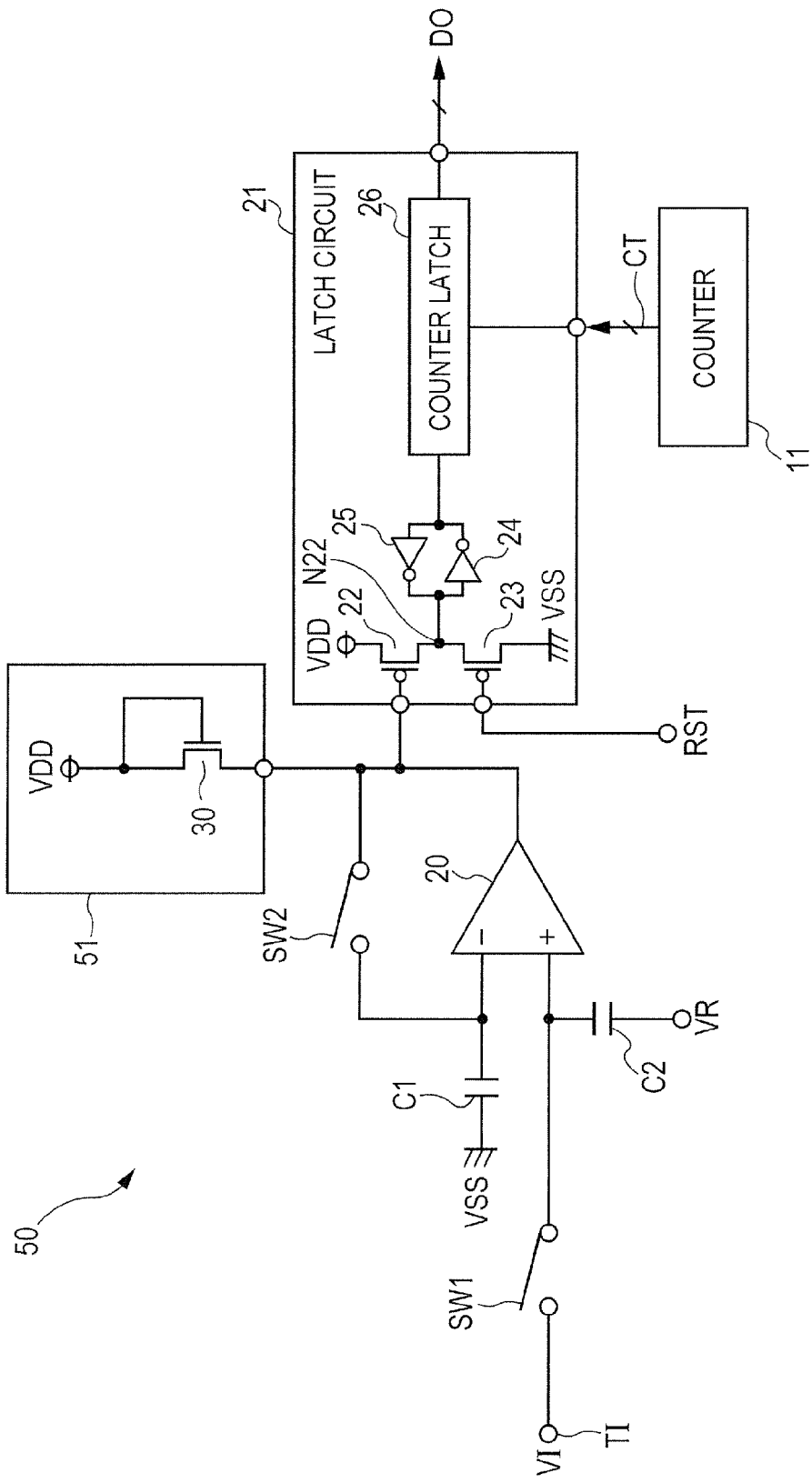
FIG. 10 is a circuit block diagram illustrating a third modification of the first embodiment.

FIG. 10 illustrates an AD converter 50 according to the third modification. A clip circuit 51 replaces the clip circuit 27. The clip circuit 51 is provided by removing the transistors 28 and 29 from the clip circuit 27. The source of the transistor 30 in the clip circuit 51 is directly coupled to the line for the power supply voltage VDD. The transistor 30 configures a diode. The clipping voltage VC is always supplied to the output terminal of the operational amplifier 20. The clipping voltage VC is limited to being lower than the reference voltage VIB for an analog signal and being lower than the threshold voltage VTH for the latch circuit 21. The third modification can provide the same effect as the first embodiment and simplify the configuration.

Fourth Modification

Figure 11:
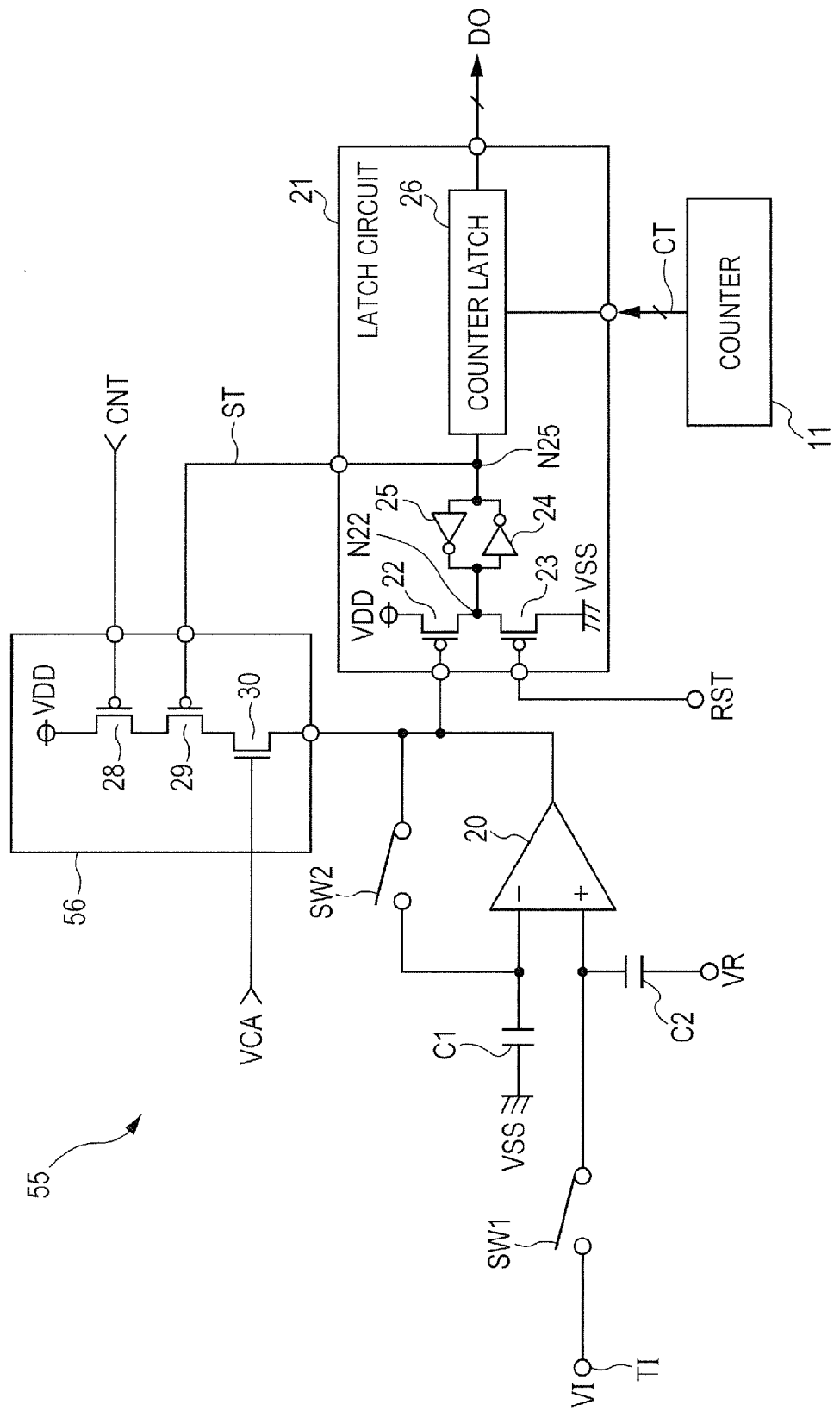
FIG. 11 is a circuit block diagram illustrating a fourth modification of the first embodiment.

FIG. 11 illustrates an AD converter 55 according to the fourth modification. A clip circuit 56 replaces the clip circuit 27. The clip circuit 56 includes the transistor 30 whose gate receives control voltage VCA. The clipping voltage VC is obtained by subtracting the threshold voltage for the transistor 30 from the control voltage VCA. Adjusting the control voltage VCA can set the clipping voltage VC to an intended value. The fourth modification can provide the same effect as the first embodiment and set the clipping voltage VC to an intended value.

Fifth Modification

Figure 12:
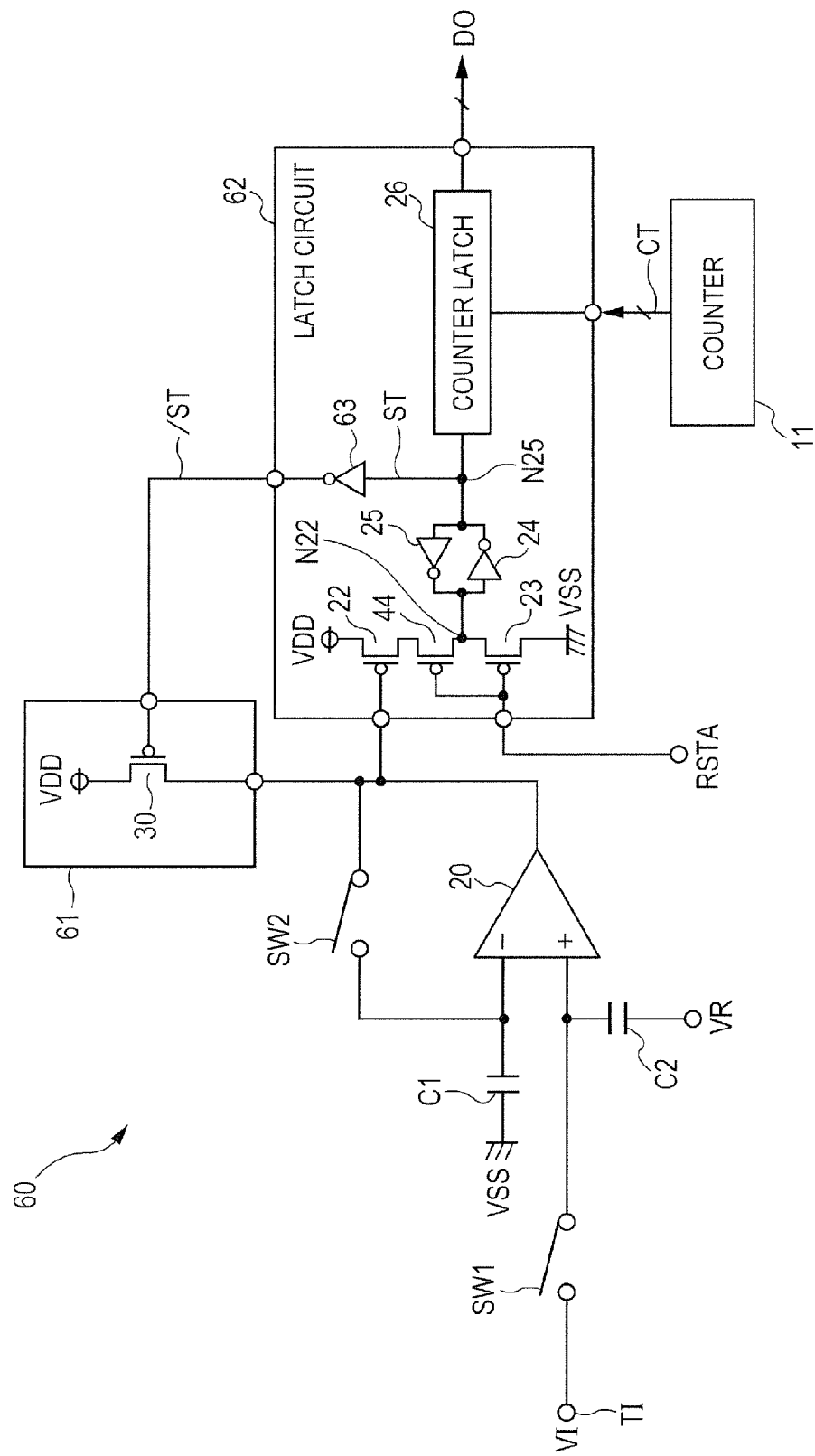
FIG. 12 is a circuit block diagram illustrating a fifth modification of the first embodiment.

FIG. 12 illustrates an AD converter 60 according to the fifth modification. A clip circuit 61 and a latch circuit 62 replace the clip circuit 27 and the latch circuit 21, respectively. The clip circuit 61 is provided by removing the transistors 28 and 29 from the clip circuit 27. The latch circuit 62 is provided by adding an inverter 63 to the latch circuit 43 in FIG. 8. The control signal CNT is removed. The reset signal RSTA replaces the reset signal RST. The transistor 30 in the clip circuit 61 is coupled between the line for the power supply voltage VDD and the output terminal of the operational amplifier 20. The inverter 63 inverts the stop signal ST appearing at the node N25. An inversion signal /ST for the stop signal ST is supplied to the gate of the transistor 30.

The reset signal RSTA is set to the H level while the switch SW2 turns on. The transistor 44 thereby turns off to turn on the transistor 23. The node N22 is set to the L level to turn off the transistor 30 and stop supplying the clipping voltage VC.

A signal output from the operational amplifier 20 transitions from the H level to the L level. The transistor then turns on to set the node N22 to the H level and set the signal /ST to the H level (power supply voltage VDD). The transistor 30 thereby cooperates with the diode to fix a voltage at the output terminal of the operational amplifier 20 to the clipping voltage VC. The fifth modification can also provide the same effect as the first embodiment.

Sixth Modification

Figure 13:
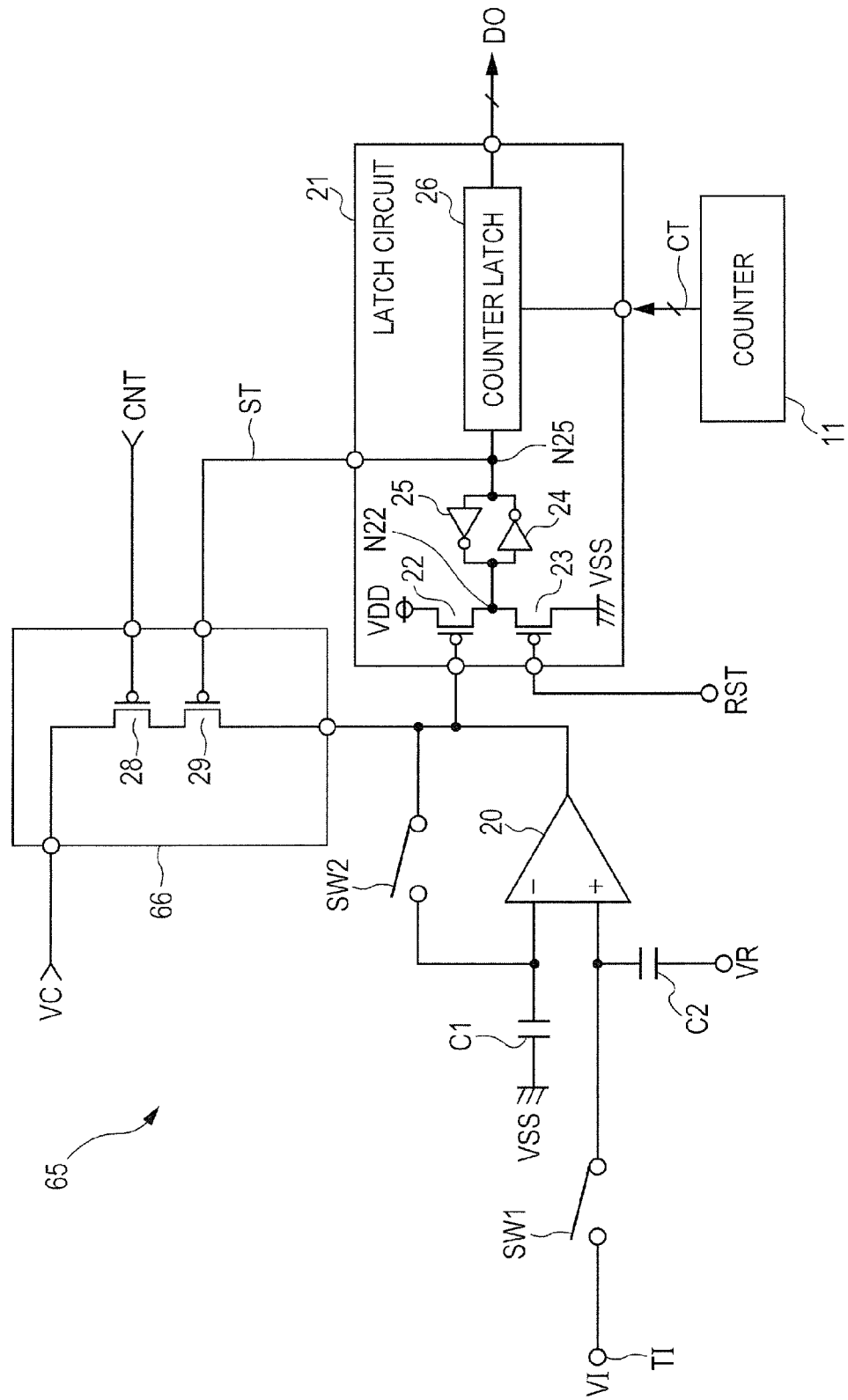
FIG. 13 is a circuit block diagram illustrating a sixth modification of the first embodiment.

FIG. 13 illustrates an AD converter 65 according to the sixth modification. A clip circuit 66 replaces the clip circuit 27. The clip circuit 66 is provided by removing the transistor 30 from the clip circuit 27. The source of the transistor 28 receives the clipping voltage VC. The drain thereof is coupled to the output terminal of the operational amplifier 20 via the transistor 29. The clipping voltage VC is adjustable to an intended value. The sixth modification can provide the same effect as the first embodiment and adjust the clipping voltage VC to an intended value.

Seventh Modification

Figure 14:
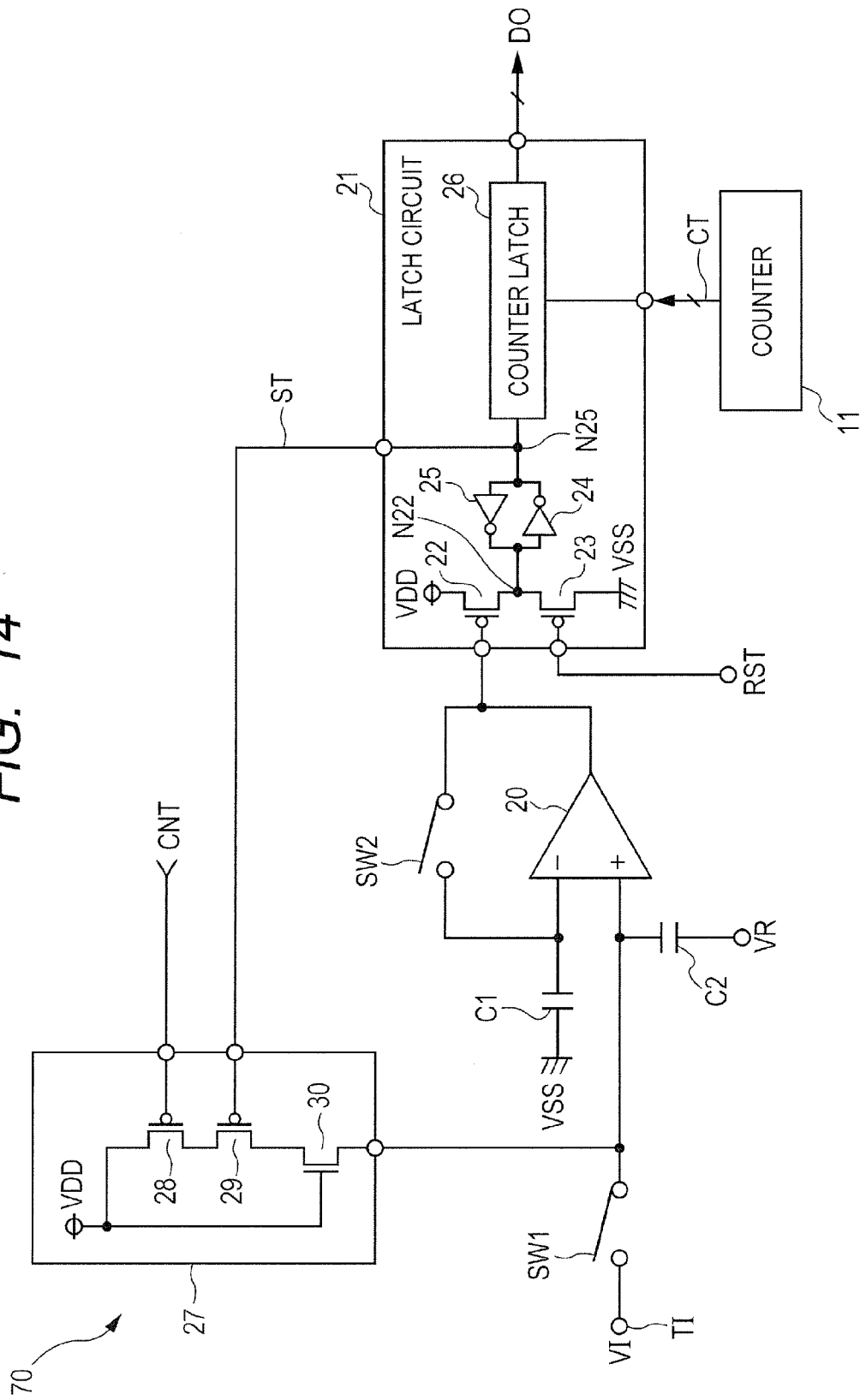
FIG. 14 is a circuit block diagram illustrating a seventh modification of the first embodiment.

FIG. 14 illustrates an AD converter 70 according to the seventh modification. The source of the transistor 30 in the clip circuit 27 is coupled to the non-inverting input terminal of the operational amplifier 20. An output signal from the operational amplifier 20 transitions from the H level to the L level to turn on the transistor 22 in the latch circuit 21. The stop signal ST then lowers to the L level from the H level. The transistor 29 in the clip circuit 27 thereby turns on to supply the clipping voltage VC to the non-inverting input terminal of the operational amplifier 20. The clipping voltage VC is configured so that an output voltage from the operational amplifier 20 becomes slightly lower than the threshold VTH for the latch circuit 21.

The seventh modification provides the same effect as the first embodiment. The seventh modification may also configure the clipping voltage VC so that the voltage at the output terminal T3 of the operational amplifier 20 becomes higher than the threshold voltage VTH for the latch circuit 21 when the stop signal ST goes to the L level. In this case, the transient current IT4 may flow through the bias voltage supply lines VPL and VNL if the clipping voltage VC is applied to the output terminal T3 of the operational amplifier 20. The transient current IT4 has the polarity opposite the transient current IT3 illustrated in FIG. 7F. The transient current IT4 may cancel the transient current IT3.

Eighth Modification

Figure 15:
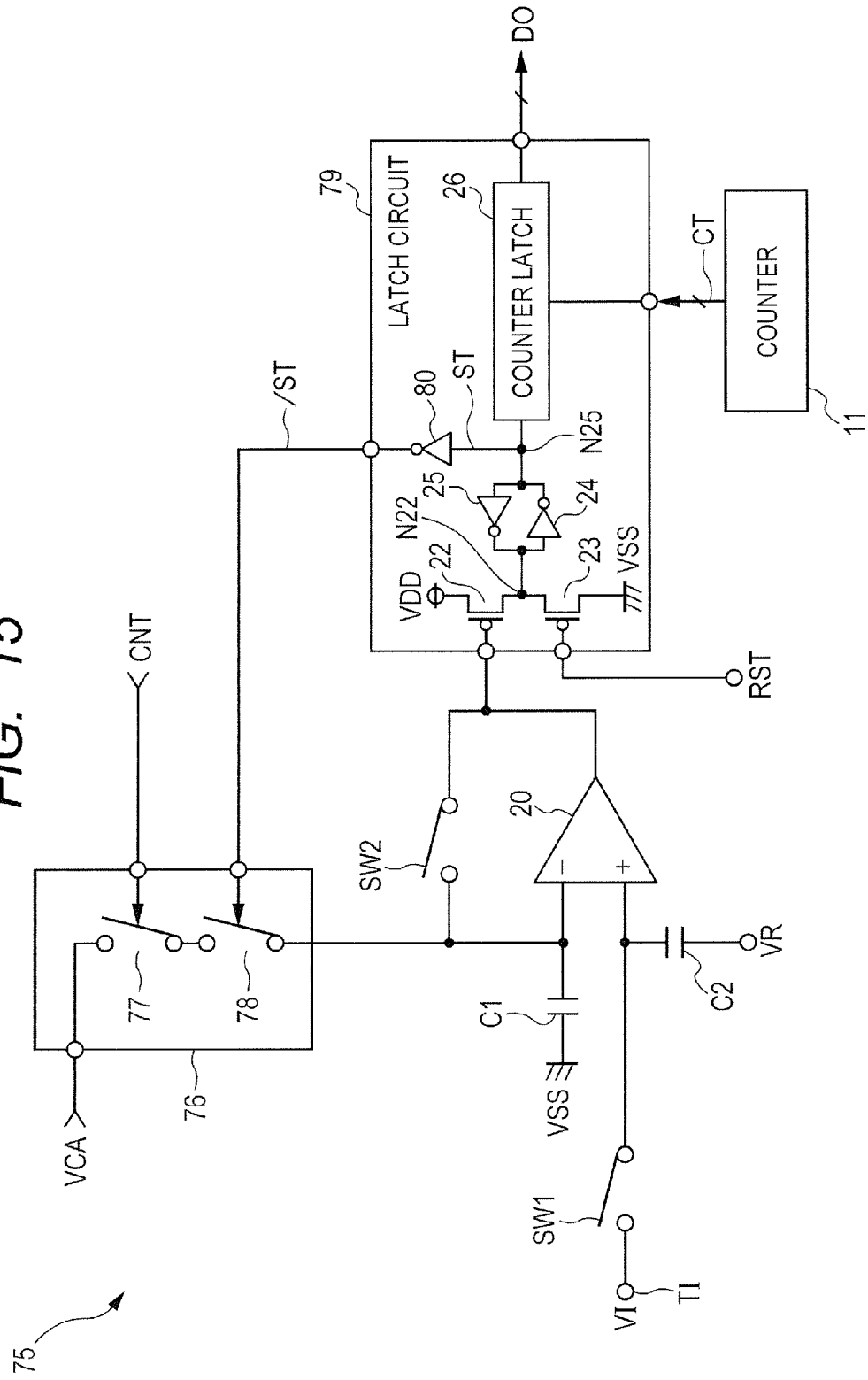
FIG. 15 is a circuit block diagram illustrating an eighth modification of the first embodiment.

FIG. 15 illustrates an AD converter 75 according to the eighth modification. A clip circuit 76 and a latch circuit 79 replace the clip circuit 27 and the latch circuit 21, respectively. The clip circuit 76 includes switches 77 and 78. One terminal of the switch 77 receives the control voltage VCA. The other terminal thereof is coupled to the inverting input terminal of the operational amplifier 20 via the switch 78. The control voltage VCA is set to be lower than a lower limit of the ramp voltage VR.

The control signal CNT controls the switch 77. The switch 77 turns off while the switch SW2 turns on. The switch 78 turns on while the inversion signal /ST for the stop signal ST is set to the H level. The switch 78 turns off while the inversion signal /ST is set to the L level. The latch circuit 79 is provided by adding an inverter 80 to the latch circuit 21. The inverter 80 generates the inversion signal /ST for the stop signal St occurring at the node N25 and supplies the inversion signal /ST to the switch 78.

A signal output from the operational amplifier 20 transitions from the H level to the L level. Turning on the transistor 22 in the latch circuit 21 raises the inversion signal /ST for the stop signal ST to the H level from the L level. The switch 78 in the clip circuit 76 thereby turns on. The control voltage VCA is supplied to the inverting input terminal of the operational amplifier 20. The output voltage for the operational amplifier 20 is raised to the H level (power supply voltage VDD).

The eighth modification forces the amplitude of an output signal from the operational amplifier 20 to be smaller than the comparative example and decreases a transient current flowing through the bias voltage supply lines VPL and VNL. The transient current IT4 may flow through the bias voltage supply lines VPL and VNL when a signal output from the operational amplifier 20 goes to the H level. The transient current IT4 has the polarity opposite the transient current IT3 illustrated in FIG. 7F. The transient current IT4 may cancel the transient current IT3.

Ninth Modification

Figure 16:
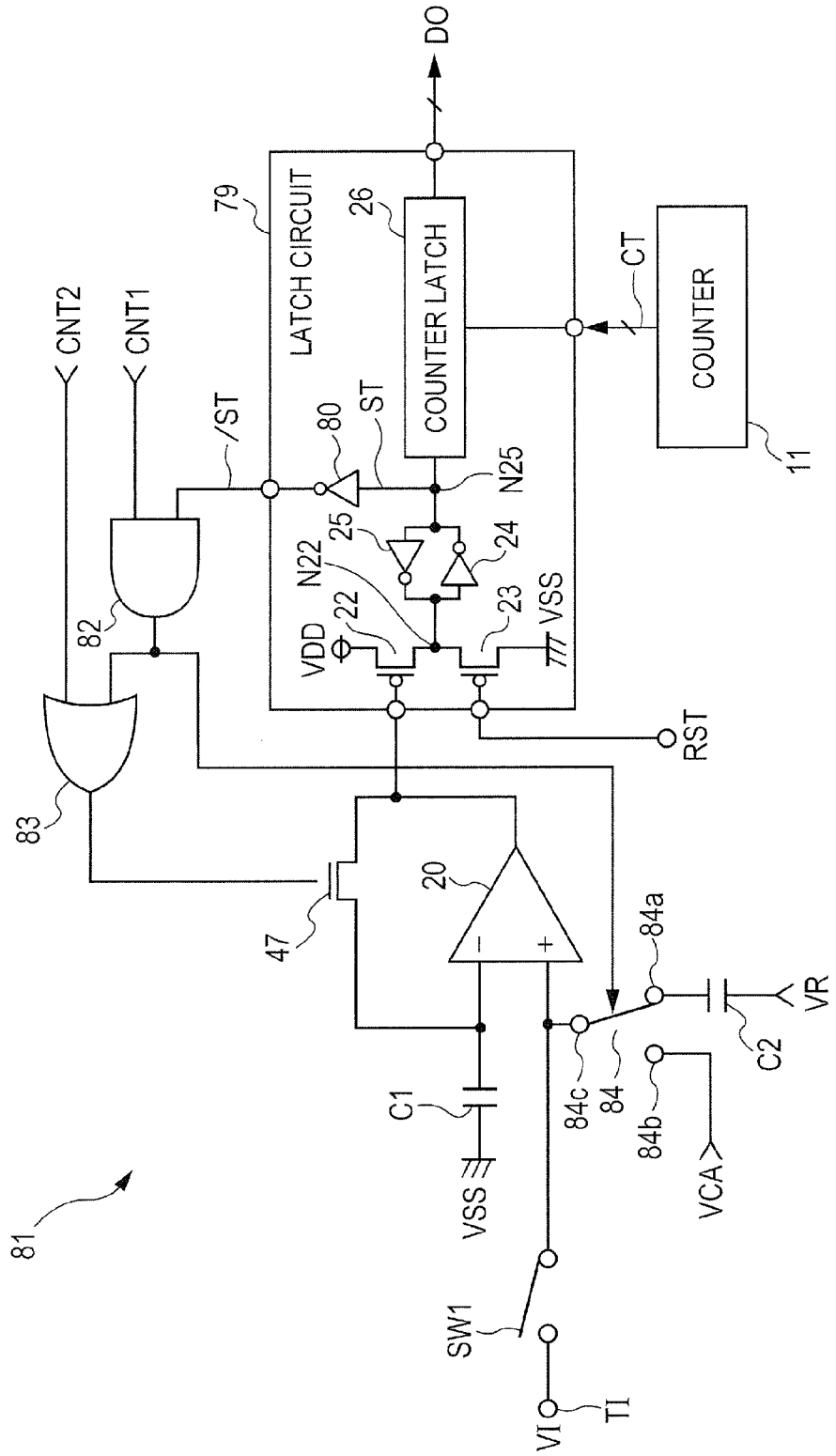
FIG. 16 is a circuit block diagram illustrating a ninth modification of the first embodiment.

FIG. 16 illustrates an AD converter 81 according to the ninth modification. The N-channel MOS transistor 47 configures the switch SW2. An AND gate 82, an OR gate 83, and a switch 84 replace the clip circuit 27. A latch circuit 79 replaces the latch circuit 21. The drain of the transistor (switch SW2) is coupled to the output terminal of the operational amplifier 20. The source thereof is coupled to the inverting input terminal of the operational amplifier 20.

The AND gate 82 outputs an AND signal between a control circuit CNT1 and output signal /ST from the latch circuit 79. The OR gate generates an AND signal between a control circuit CNT2 and an output signal from the AND gate 82 and supplies the AND signal to the gate of the transistor 47. One switch terminal 84a of the switch 84 is coupled to the other electrode of the capacitor C2. The other switch terminal 84b thereof receives the control voltage VCA. A common terminal 84c thereof is coupled to the non-inverting input terminal of the operational amplifier 20. The switch 84 turns on between the terminals 84a and 84c when a signal output from the AND gate is set to the L level. The switch 84 turns on between the terminals 84b and 84c when a signal output from the AND gate is set to the H level.

A control signal CNT2 controls the transistor 47 (switch SW2). The control signal CNT2 is set to the H level to turn on the transistor 47 when the capacitor C1 maintains the reference voltage VIB for the analog signal. Otherwise, the control signal CNT2 is set to the L level.

A control signal CNT1 controls the transistor 47 (SW2) and the switch 84. The control signal CNT1 is set to the H level when the voltage VIP maintained in the capacitor C2 is converted into the digital signal DO. Otherwise, the control signal CNT1 is set to the L level.

Setting the reset signal RST to the H level for a specified time resets the latch circuit 79 and sets the signal /ST to the L level. A signal output from the AND gate 82 thereby goes to the L level. The switch 84 turns on between the terminals 84a and 84c. The other electrode of the capacitor C2 is coupled to the non-inverting input terminal of the operational amplifier 20.

The capacitors C1 and C2 are charged to the reference voltage VIB and the signal voltage VIP, respectively. After that, the ramp voltage VR gradually decreases from the highest value to the lowest value. An output voltage of the operational amplifier 20 gradually transitions from the H level to the L level. When the output voltage of the operational amplifier 20 becomes lower than the threshold voltage VTH for the latch circuit 79, the transistor 22 turns on to raise the signal /ST to the H level from the L level. A signal output from the AND gate 82 thereby goes to the H level. A signal output from the OR gate 83 also goes to the H level. As a result, the transistor 47 turns on. The switch 84 turns on between the terminals 84b and 84c. The output voltage of the operational amplifier 20 is used as the control voltage VCA. In this case, the control voltage VCA is configured so that the output voltage of the operational amplifier 20 is slightly lower than the threshold voltage VTH for the latch circuit 79, for example.

The ninth modification also provides the same effect as the first embodiment. The ninth modification may configure the control voltage VCA so that the output voltage of the operational amplifier 20 becomes higher than the threshold voltage VTH for the latch circuit 79 when the signal /ST goes to the H level. In this case, the transient current IT4 may flow through the bias voltage supply lines VPL and VNL when the output voltage of the operational amplifier 20 becomes the control voltage VCA. The transient current IT4 has the polarity opposite the transient current IT3 illustrated in FIG. 7F. The transient current IT4 may cancel the transient current IT3.

Tenth Modification

Figure 17:
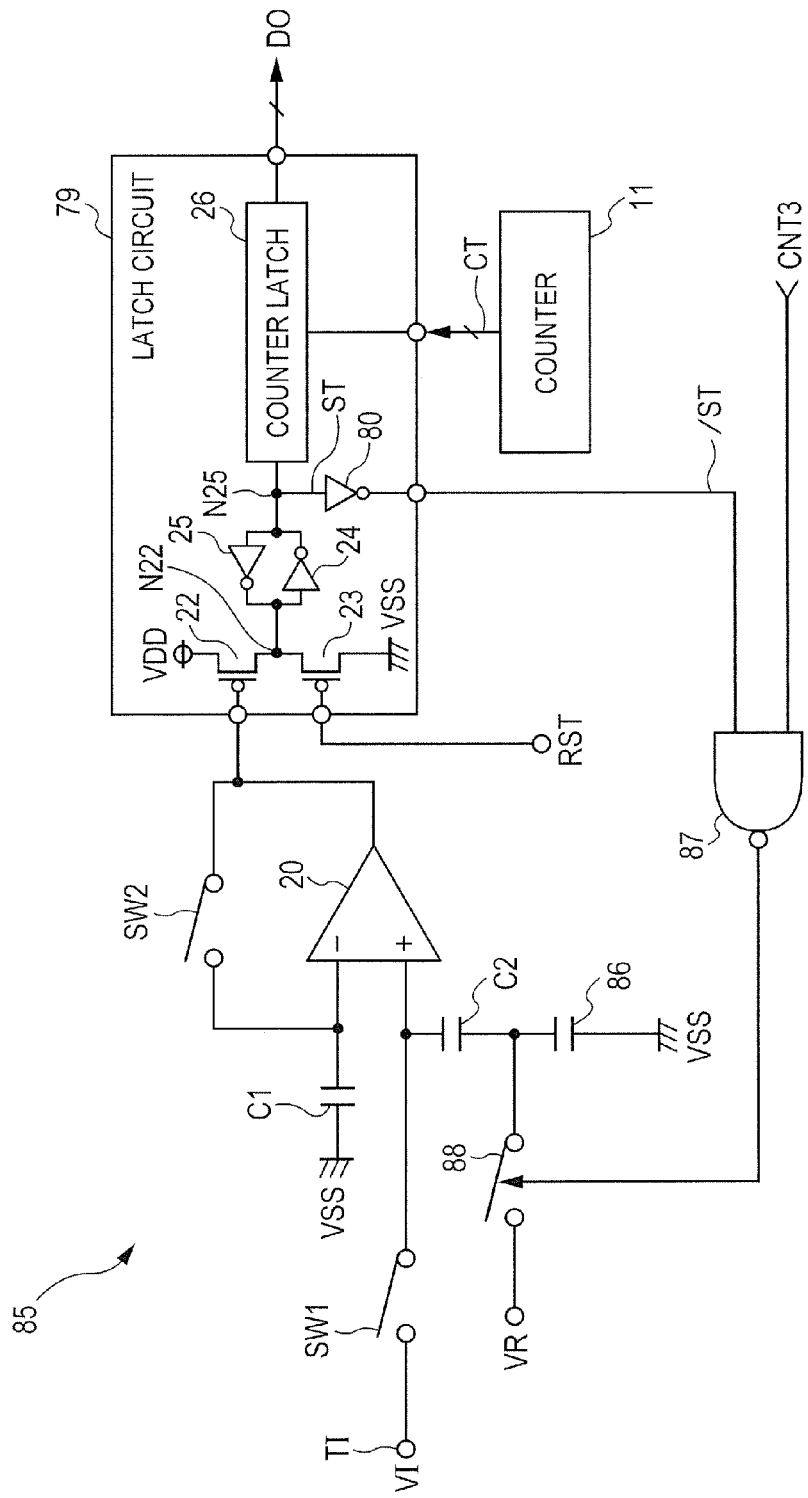
FIG. 17 is a circuit block diagram illustrating a tenth modification of the first embodiment.

FIG. 17 illustrates an AD converter 85 according to the tenth modification. A capacitor 86, a NAND gate 87, and a switch 88 replace the clip circuit 27. A latch circuit 79 configures the latch circuit 21. The capacitors C2 and 86 are coupled in series between the non-inverting input terminal of the operational amplifier 20 and the line for the ground voltage VSS. The NAND gate 87 outputs an inversion signal for the AND signal between the signal /ST output from the latch circuit 79 and the control signal CNT3. One terminal of the switch 88 receives the ramp voltage VR. The other terminal thereof is coupled to a node between the capacitors C2 and 86. The switch 88 turns on when a signal output from the NAND gate 87 is H level. The switch 88 turns off when a signal output from the NAND gate 87 is L level.

The control signal CNT3 controls the switch 88. The control signal CNT3 is set to the H level when the voltage VIP maintained in the capacitor C2 is converted into the digital signal DO. Otherwise, the control signal CNT3 is set to the L level. When the control signal CNT3 is set to the L level, a signal output from the NAND gate is set to the H level. The switch 88 turns on to supply the ramp voltage VR to the node between the capacitors C2 and 86.

Setting the reset signal RST to the H level for a specified time resets the latch circuit 79 and sets the signal /ST to the L level. The capacitors C1 and C2 are charged to the reference voltage VIB and the signal voltage VIP, respectively. After that, the control signal CNT3 is set to the H level.

The ramp voltage VR gradually decreases from the highest value to the lowest value. An output voltage of the operational amplifier 20 gradually transitions from the H level to the L level. When the output voltage of the operational amplifier 20 becomes lower than the threshold voltage VTH for the latch circuit 79, the transistor 22 turns on to raise the signal /ST to the H level from the L level. A signal output from the NAND gate 87 thereby goes to the L level. The switch 88 turns off to keep constant a voltage for the node between the capacitors C2 and 86 and stop the output voltage of the operational amplifier 20 from transitioning. The tenth modification also provides the same effect as the first embodiment.

Second Embodiment

Figure 18:
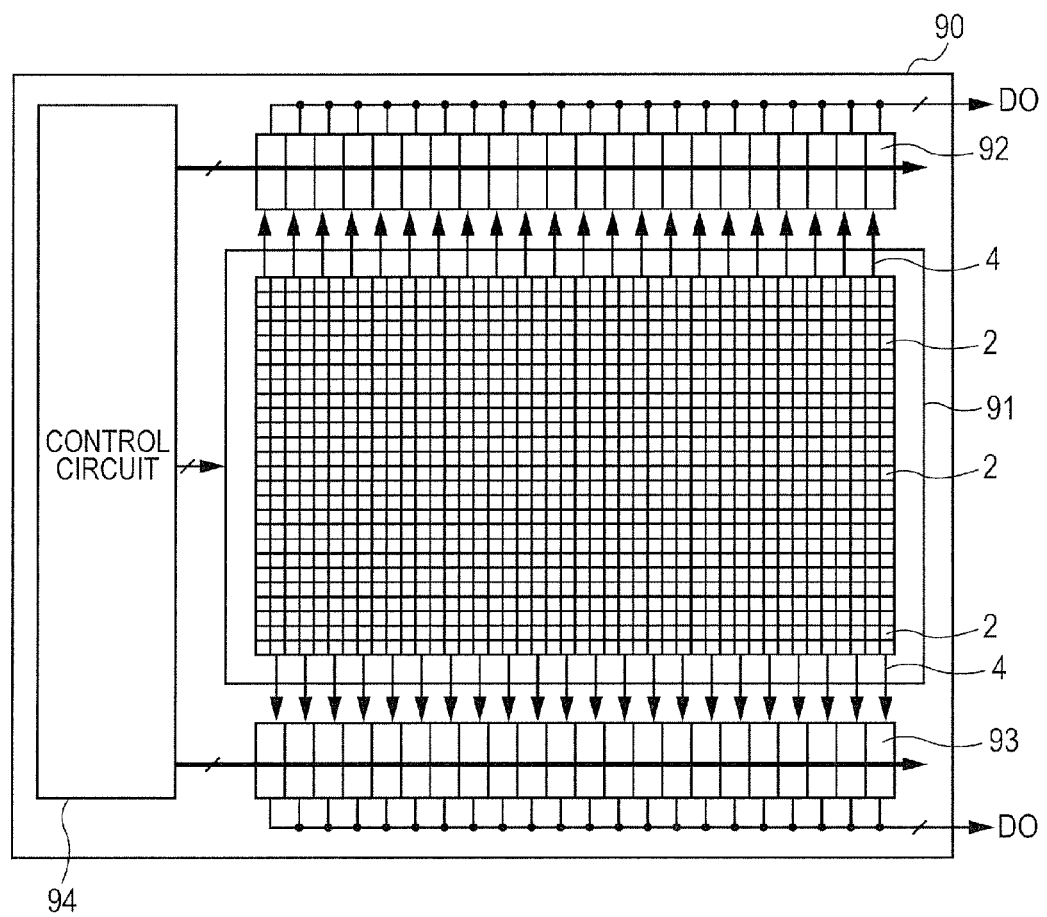
FIG. 18 is a block diagram illustrating a configuration of a solid-state imaging apparatus according to a second embodiment of the invention.

FIG. 18 is a block diagram illustrating a configuration of a solid-state imaging apparatus 90 according to the second embodiment of the invention. As illustrated in FIG. 18, the solid-state imaging apparatus 90 includes a pixel array 91, AD converters 92 and 93, and a control circuit 94. The pixel array 91 has the same configuration as that of the pixel array 1 illustrated in FIG. 1. The pixel array 91 includes pixel circuits 2, row selection line groups (not illustrated), and signal lines 4. The pixel circuits 2 are provided for columns and rows. The row selection line groups are provided corresponding to the rows. The signal lines 4 are provided corresponding to the columns.

A series of AD converters 92 is provided along one side (top side in FIG. 18) of the pixel array 91. The AD converters 92 correspond to odd-numbered columns of the pixel array 91. Each AD converter 92 is coupled to the signal line 4 for the corresponding column.

A series of AD converters 93 is provided along the other side (bottom side in FIG. 18) of the pixel array 91. The AD converters 93 correspond to even-numbered columns of the pixel array 91. Each AD converter 93 is coupled to the signal line 4 for the corresponding column.

The control circuit 94 includes the vertical scanning circuit 5, the control circuit 6, and the horizontal scanning circuit 7 illustrated in FIG. 1. The control circuit 94 successively selects the rows at a specified time interval and allows the row selection line group for the selected row to activate the pixel circuit 2 corresponding to the row. The pixel circuit 2 includes a photo diode and a selection transistor. The pixel circuit 2 for the selected row outputs the reference voltage VIB for the analog signal to the corresponding signal line 4 during the first period and outputs the signal voltage VIP for the analog signal to the corresponding signal line 4 during the second period.

While one row is selected, the control circuit 94 successively selects the signal lines 4 at a specified time interval. The AD converters 92 and 93 are supplied with an analog signal from the activated pixel circuit 2 via the corresponding signal line 4 and convert the analog signal into the digital signal DO based on the ramp voltage VR from the control circuit 94. The AD converters 92 and 93 output the generated digital signal DO to the outside via the data bus when the control circuit 94 selects the corresponding signal line 4.

Figure 19:
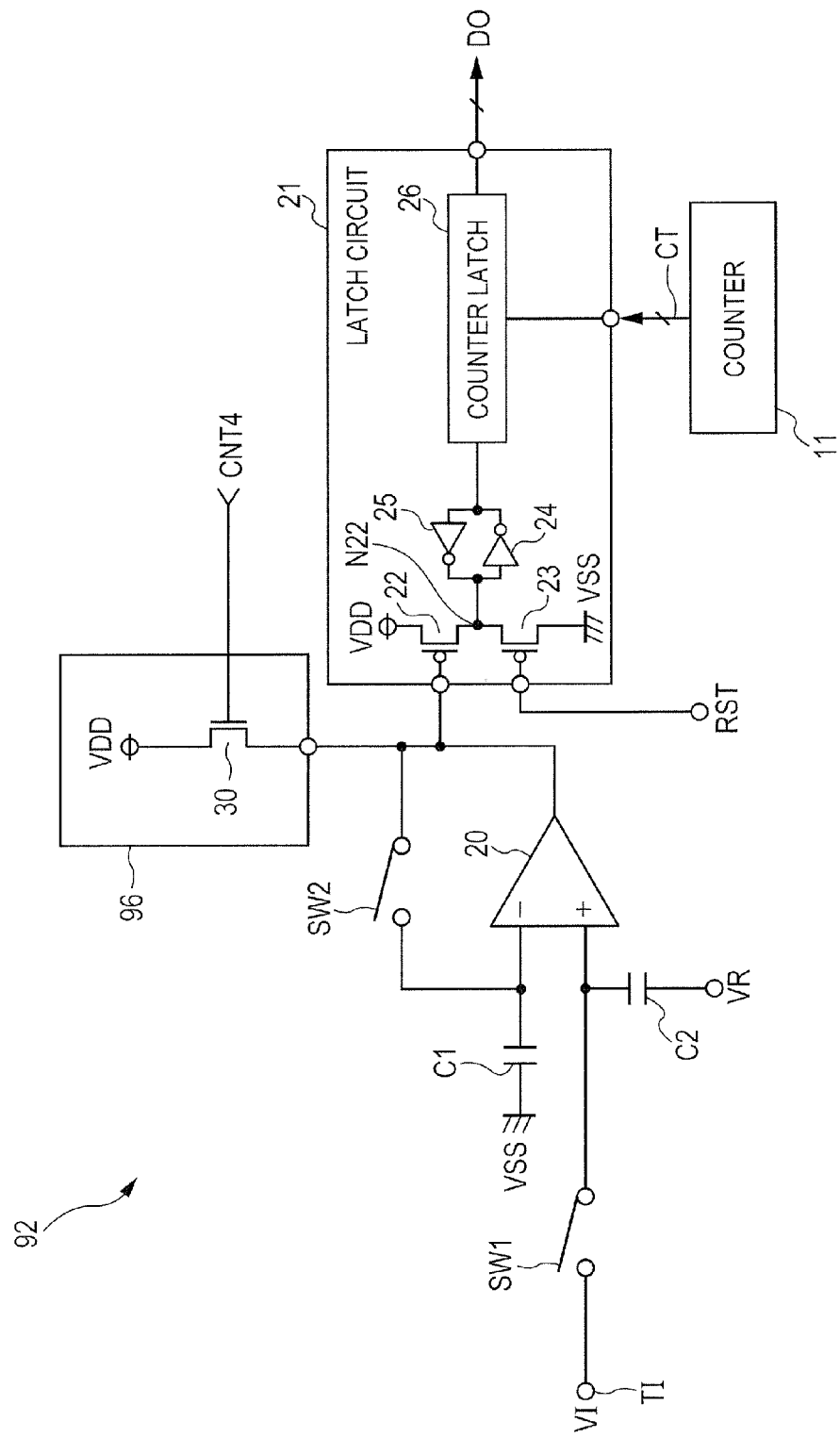
FIG. 19 is a block diagram illustrating a configuration of an AD converter illustrated in FIG. 18.

FIG. 19 is a block diagram illustrating a configuration of the AD converter 92 for comparison with FIG. 3. The AD converter 92 differs from the AD converter 8 in FIG. 3 in that a clip circuit 96 replaces the clip circuit 27 and control signal CNT4 replaces the control signal CNT. A logical-level voltage for the control signal CNT4 is set to a specified bias value (to be described) instead of a digital value specified in the power supply voltage VDD or the ground voltage VSS. The clip circuit 96 is provided by removing the transistors 28 and 29 from the clip circuit 27. The drain of the transistor 30 receives the power supply voltage VDD. The source thereof is coupled to the output terminal of the operational amplifier 20. The gate thereof receives the control signal CNT4.

The control signal CNT4 is set to the L level while the switch SW2 turns on. Otherwise, the control signal CNT4 is set to the H level. A voltage value for the control signal CNT4 at the L level is configured so that the source potential of the transistor 30 is lower than the reference voltage VIP of the analog signal. This is because the reference voltage VIB for the analog signal needs to be applied to the inverting input terminal of the operational amplifier 20 while the switch SW2 turns on.

If the source potential of the transistor 30 is higher than the reference voltage VIB, the source potential of the transistor 30 is applied to the inverting input terminal. The reference voltage VIB cannot be correctly applied to the inverting input terminal. To solve this problem, the control signal CNT4 needs to be lowered to the voltage value for the L level so that the clip circuit 96 does not operate during this period. For example, suppose the reference voltage VIB is 1.2 V and the threshold voltage for the transistor 30 is 0.7 V. Then, the gate potential of the transistor 30 just needs to be lower than 1.2+0.7=1.9 V. Accordingly, the L level for the control signal CNT4 is set to 1.5 V, for example.

When the control signal CNT4 is set to the H level, the transistor 30 operates as a source follower. The clipping voltage VC is supplied to the output terminal of the operational amplifier 20. The clipping voltage VC, i.e., the source potential of the transistor 30, is lower than the gate potential by the threshold voltage for the transistor 30. The clipping voltage VC is configured to be slightly lower than the threshold voltage VTH for the latch circuit 21. The AD converter 93 has the same configuration as the AD converter 92.

Figure 20:
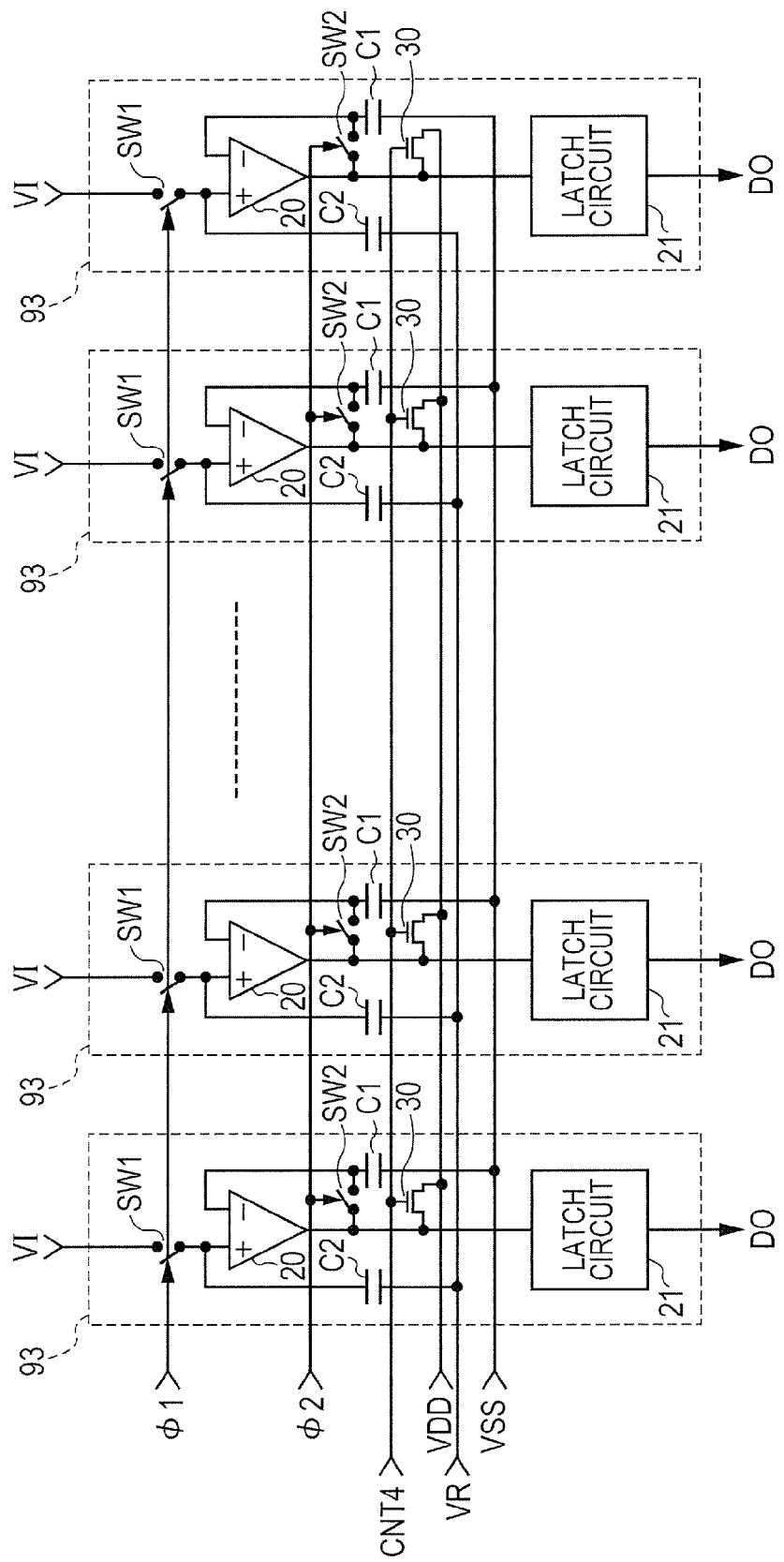
FIG. 20 is a circuit block diagram illustrating a series of AD converters illustrated in FIG. 18.

FIG. 20 is a circuit block diagram illustrating a configuration of a series of AD converters 93. As illustrated in FIG. 20, one signal φ1 controls the switches SW1 in the AD converters 93. One signal φ2 controls the switches SW2. One control signal CNT4 controls the transistors 30. As illustrated in FIG. 2, the operational amplifiers 20 are provided with the bias voltage supply lines VPL and VNL in common.

Figure 21:
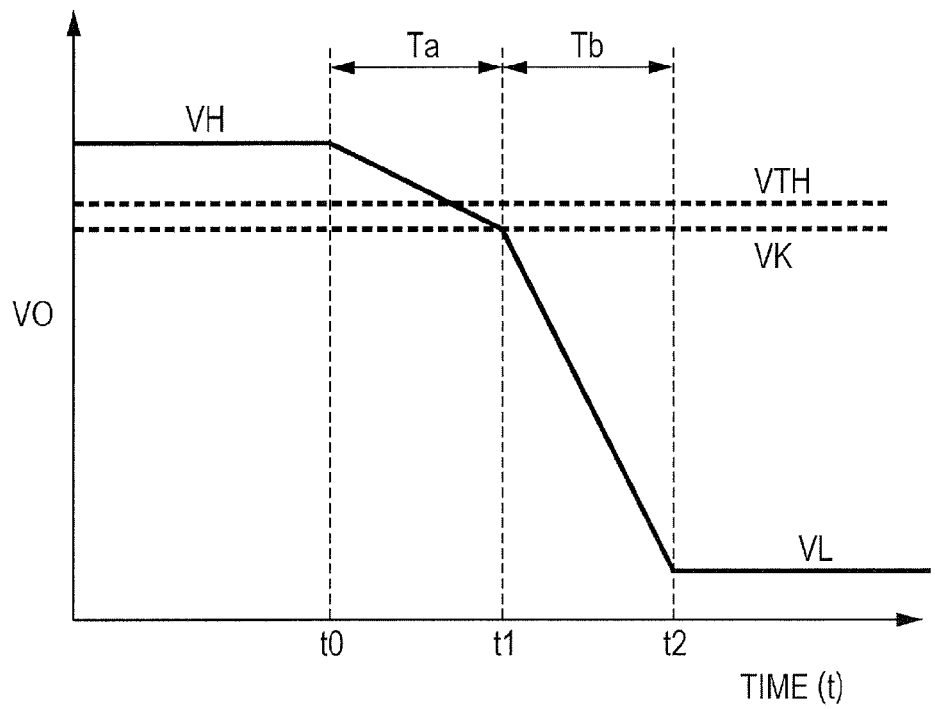
FIG. 21 is a timing chart illustrating relationship between an output voltage and a clipping voltage for the AD converter illustrated in FIG. 19.

FIG. 21 is a timing chart illustrating output voltage VO of the operational amplifier 20. At time t0 in FIG. 21, the output voltage VO of the operational amplifier 20 starts transitioning from the H level VH to the L level VL. The output voltage VO of the operational amplifier 20 does not drop at a constant speed. Suppose drop speed vb during period Tb under the condition of VO<VK and drop speed va during period Ta under the condition of VO>VK. Then, drop speed vb is higher than drop speed va. A change in the voltage VO causes a noise to occur on the bias voltage supply lines VPL and VNL if the AD converter 40 according to the comparative example illustrated in FIG. 6 is used. The noise occurs mainly during period Tb. Therefore, the clipping voltage VC is favorably specified between the threshold voltage VTH and voltage VK.

Figure 22:
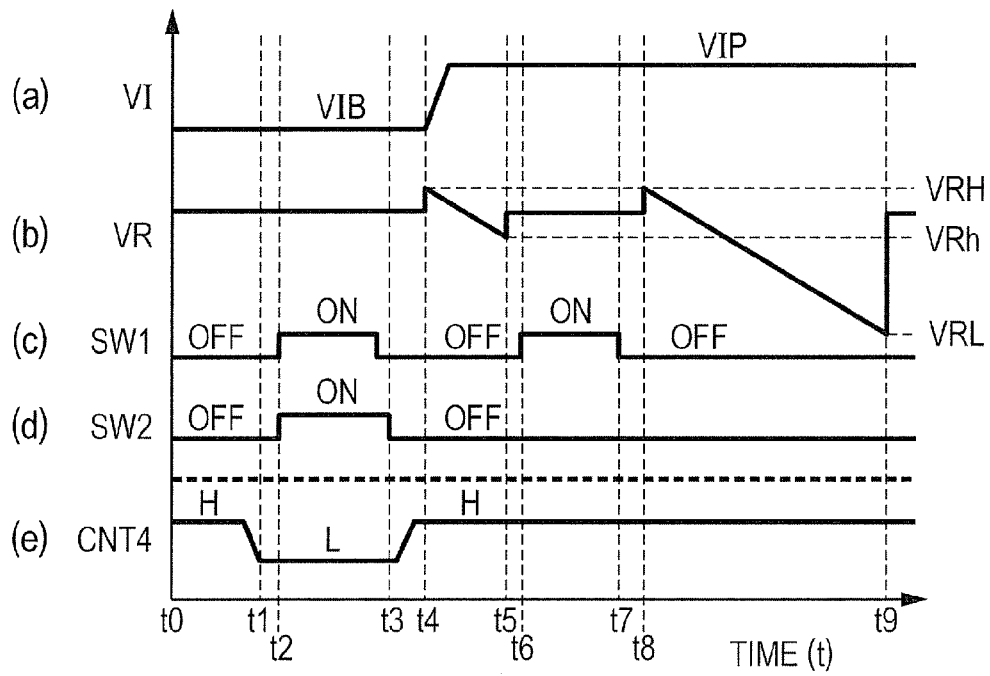
FIG. 22 is a timing chart illustrating operations of the AD converter illustrated in FIG. 19.

FIG. 22 is a timing chart illustrating operations of the AD converter 92 illustrated in FIG. 19. If the vertical scanning circuit 5 selects a row, the pixel circuits 2 corresponding to the row are activated. At t0, the pixel circuits 2 are reset and output the reference voltage VIE (black level) for an analog signal to the signal line 4.

At time t1, the control signal CNT4 lowers from the H level (e.g., 2.5 V) to the L level (e.g., 1.5 V) to turn off the transistor 30. At time t2, the switches SW1 and SW2 turn on to charge the inverting input terminal T2 of the operational amplifier 20 with the reference voltage VIB for the analog signal.

At time t3, the switches SW1 and SW2 turn off and the control signal CNT4 is set to the H level. The transistor 30 thereby operates as a source follower. The output terminal of the operational amplifier 20 is charged with the clipping voltage VC. At time t4, each pixel circuit 2 corresponding to the selected row outputs the signal voltage VIP for the analog signal to the signal line 4. Between time t4 and t5, the ramp voltage VR linearly drops from the highest value VRH to high value VRh in proportion to the time lapse. An offset voltage for the operational amplifier 20 is measured during this period. Since the offset voltage is small, a small voltage difference is provided between the highest value VRH and the high value VRh for the ramp voltage VR.

While the ramp voltage VR drops in proportion to the time, the capacitive coupling via the capacitor C2 also drops the voltage at the non-inverting input terminal in proportion to the time. The voltage at the non-inverting input terminal becomes lower than the voltage at the inverting input terminal. The operational amplifier 20 then allows the voltage at the output terminal to transition to the L level VL from the H level VH.

The voltage at the output terminal of the operational amplifier 20 reaches the threshold voltage VTH for the latch circuit 21. Then, the transistor 22 turns on to lower the stop signal ST from the H level to the L level. The counter latch 26 thereby latches the signal CT output from the counter 11. The latched signal CT becomes the digital signal DO. At this time, the digital signal DO1 indicates the offset voltage of the operational amplifier 20.

Between time t6 and t7, the switch SW1 turns on. The non-inverting input terminal of the operational amplifier 20 is thereby charged with the signal voltage VIP for the analog signal. The output terminal of the operational amplifier 20 is set to the H level VH. Between time t8 and t9, the ramp voltage VR linearly drops from the highest value VRH to the lowest value VRL in proportion to the time lapse. The signal voltage VIP of the analog signal is measured during this period. The signal voltage VIP rises in proportion to the amount of incident light on the pixel circuit 2. A large voltage difference is provided between the highest value VRH and the lowest value VRL for the ramp voltage VR.

While the ramp voltage VR drops in proportion to the time, the capacitive coupling via the capacitor C2 also drops the voltage at the non-inverting input terminal in proportion to the time. The voltage at the non-inverting input terminal becomes lower than the voltage at the inverting input terminal. The operational amplifier 20 then allows the voltage at the output terminal to transition to the L level VL from the H level VH.

The voltage at the output terminal T3 of the operational amplifier 20 reaches a voltage that is lower than the threshold voltage VTH for the latch circuit 21. Then, the transistor 22 turns on to lower the stop signal ST from the H level to the L level. The counter latch 26 thereby latches the signal CT output from the counter 11. The latched signal CT becomes the digital signal DO. At this time, the digital signal DO2 indicates a voltage difference between the signal voltage VIP and the reference voltage VIB for the analog signal. A difference between the digital signals DO2 and DO1 indicates the amount of incident light on the pixel circuit 2. The second embodiment provides the same effect as the first embodiment.

The above-mentioned solid-state imaging apparatus is formed on a semiconductor chip and is applied to a camera system. The pixel array receives the incident light through a lens in the camera system. A digital signal generated from the solid-state imaging apparatus is output to a signal processing portion of the camera system via the data bus.

The above-mentioned embodiments should be regarded as illustrative examples, not regarded as being restrictive, in all aspects. The appended claims, not the above description, provide the scope of the invention. This intends to include all changes in meanings and ranges equivalent to the appended claims.

What is claimed is:

1. A solid-state imaging apparatus, comprising:
   a plurality of pixel circuits, each of which is configured to output an analog signal responding to an amount of incident light;
   a plurality of row selection lines and a plurality of signal lines coupled to the plurality of pixel circuits;
   a plurality of analog-to-digital (AD) converters, each of which is coupled to one of the signal lines and is configured to convert an analog signal from an activated pixel circuit in the plurality of pixel circuits into a first digital signal; and
   a latch circuit,
   each of the AD converters comprising:
   an operational amplifier having an input node configured to input the analog signal from the activated pixel circuit via the signal line, and an output node; and
   a bias voltage supply line configured to supply a bias voltage to each of the plurality of AD converters,
   wherein a power supply voltage is supplied to the operational amplifier in each of the AD converters,
   wherein the latch circuit is coupled to the output node of the operational amplifier and configured to generate a stop signal based on a signal outputted from the output node of the operational amplifier and to latch a second digital signal when a transition of the stop signal occurs,
   wherein a clip circuit is coupled to the output node of the operational amplifier and configured to input the stop signal and make an amplitude of a voltage level of the output node of the operational amplifier less than the power supply voltage when the transition of the stop signal occurs.

2. A solid-state imaging apparatus, comprising:
   a plurality of pixel circuits, each of which outputs an analog signal responding to an amount of incident light;
   a plurality of row selection lines and a plurality of signal lines coupled to the plurality of pixel circuits;
   a plurality of AD converters, each of which is coupled to one of the signal lines and is configured to convert an analog signal from an activated pixel circuit in the plurality of pixel circuits into a digital signal,
   each of the AD converters comprising:
   an operational amplifier having an input node for inputting the analog signal from the activated pixel circuit via the signal line, and
   an output node; and
   a bias voltage supply line configured to supply a bias voltage to each of the plurality of AD converters,
   wherein a power supply voltage is supplied to the operational amplifier in each of the AD converters,
   wherein a clip circuit is coupled to the output node of the operational amplifier, which is configured to make an amplitude of a voltage level of the output node of the operational amplifier less than the power supply voltage,
   wherein the clip circuit is comprised of an N-type MOSFET,
   wherein the power supply voltage is supplied to a drain electrode of the N-type MOSFET, wherein a source electrode of the N-type MOSFET is coupled to the output node of the operational amplifier.

3. A solid-state imaging apparatus according to claim 1, wherein the plurality of pixel circuits are disposed in rows and columns.

4. A solid-state imaging apparatus according to claim 1, wherein a control circuit configured to select one of the row selection lines and activate each pixel circuit is disposed.

5. A solid-state imaging apparatus according to claim 1, wherein the bias voltage is supplied to the operational amplifier.

6. A solid-state imaging apparatus according to claim 4, wherein the operational amplifier is comprised of a plurality of MOSFETs,
wherein the bias voltage is supplied to a gate electrode of a MOSFET in the plurality of MOSFETs.

7. A solid-state imaging apparatus according to claim 1, wherein the operational amplifier includes a current mirror circuit.

8. A solid-state imaging apparatus according to claim 1, wherein the latch circuit includes a P-type MOSFET and an inverter, wherein:
a gate of the P-type MOSFET is coupled to the output node of the operational amplifier,
the power supply voltage is supplied to a source of the P-type MOSFET, and
the inverter has an input node coupled to a drain of the P-type MOSFET and an output node configured to output the stop signal.

9. A solid-state imaging apparatus according to claim 1, wherein the clip circuit includes a P-type MOSFET having a gate configured to receive the stop signal.

10. A solid-state imaging apparatus according to claim 1, wherein the clip circuit includes an N-type MOSFET, wherein:
a source electrode of the N-type MOSFET is coupled to the output node of the operational amplifier, and
a drain electrode of the N-type MOSFET is coupled to a drain of the P-type MOSFET of the clip circuit.

11. A solid-state imaging apparatus according to claim 1, wherein the transition of the stop signal is a transition of the stop signal from an "H" level to an "L" level.

* * * * *